United States Patent
Lin et al.

(10) Patent No.: US 10,249,725 B2
(45) Date of Patent: Apr. 2, 2019

(54) TRANSISTOR WITH A GATE METAL LAYER HAVING VARYING WIDTH

(71) Applicant: DELTA ELECTRONICS, INC., Taoyuan (TW)

(72) Inventors: Li-Fan Lin, Taoyuan (TW); Chun-Chieh Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/236,497

(22) Filed: Aug. 15, 2016

(65) Prior Publication Data

US 2018/0047822 A1 Feb. 15, 2018

(51) Int. Cl.
| | |
|---|---|
| H01L 29/423 | (2006.01) |
| H01L 29/20 | (2006.01) |
| H01L 29/205 | (2006.01) |
| H01L 29/778 | (2006.01) |
| H01L 23/48 | (2006.01) |
| H01L 29/417 | (2006.01) |
| H01L 29/10 | (2006.01) |

(52) U.S. Cl.
CPC ........ *H01L 29/42316* (2013.01); *H01L 23/48* (2013.01); *H01L 29/2003* (2013.01); *H01L 29/205* (2013.01); *H01L 29/7787* (2013.01); H01L 29/1066 (2013.01); H01L 29/41766 (2013.01)

(58) Field of Classification Search
CPC ........... H01L 29/42316; H01L 29/2003; H01L 29/205; H01L 29/7787
See application file for complete search history.

(56) References Cited

U.S. PATENT DOCUMENTS

| | | | |
|---|---|---|---|
| 8,823,012 B2 | 9/2014 | Lidow et al. | |
| 2008/0272443 A1* | 11/2008 | Hoshi | H01L 29/2003 257/409 |
| 2011/0248283 A1 | 10/2011 | Cao et al. | |
| 2013/0146946 A1* | 6/2013 | Tsurumi | H01L 29/4175 257/192 |
| 2015/0243657 A1* | 8/2015 | Lin | H01L 29/402 257/401 |
| 2016/0087074 A1* | 3/2016 | Prechtl | H01L 21/32051 438/652 |

(Continued)

FOREIGN PATENT DOCUMENTS

| | | |
|---|---|---|
| CN | 102544002 A | 7/2012 |
| TW | I521695 B | 2/2016 |

*Primary Examiner* — Peter Bradford
(74) *Attorney, Agent, or Firm* — CKC & Partners Co., LLC

(57) ABSTRACT

A semiconductor device includes an active layer, a source electrode, a drain electrode, a gate electrode, a first insulating layer, a gate metal layer, a via, a first source metal layer, a drain metal layer, and a second source metal layer. The source electrode, the drain electrode, and the gate electrode are present on the active layer. The first insulating layer is present on the source electrode, the drain electrode, and the gate electrode. The gate metal layer, the first source metal layer, the second source metal layer, and the drain metal layer are present on the first insulating layer. The gate metal layer includes a narrow portion and a wider portion. The via is present between the metal gate layer and the gate electrode. The second source metal layer is present between the gate metal layer and the drain metal layer.

20 Claims, 30 Drawing Sheets

(56) References Cited

U.S. PATENT DOCUMENTS

| | | | |
|---|---|---|---|
| 2016/0225889 A1* | 8/2016 | Umeno | H01L 29/47 |
| 2016/0260615 A1* | 9/2016 | Hirai | H01L 21/28114 |
| 2016/0380062 A1* | 12/2016 | Zhang | H01L 29/402 |
| | | | 257/409 |
| 2016/0380091 A1* | 12/2016 | Okawa | H01L 29/475 |
| | | | 257/194 |
| 2017/0047437 A1* | 2/2017 | Nakayama | H01L 21/2258 |
| 2017/0069744 A1* | 3/2017 | Roberts | H01L 21/26506 |

* cited by examiner

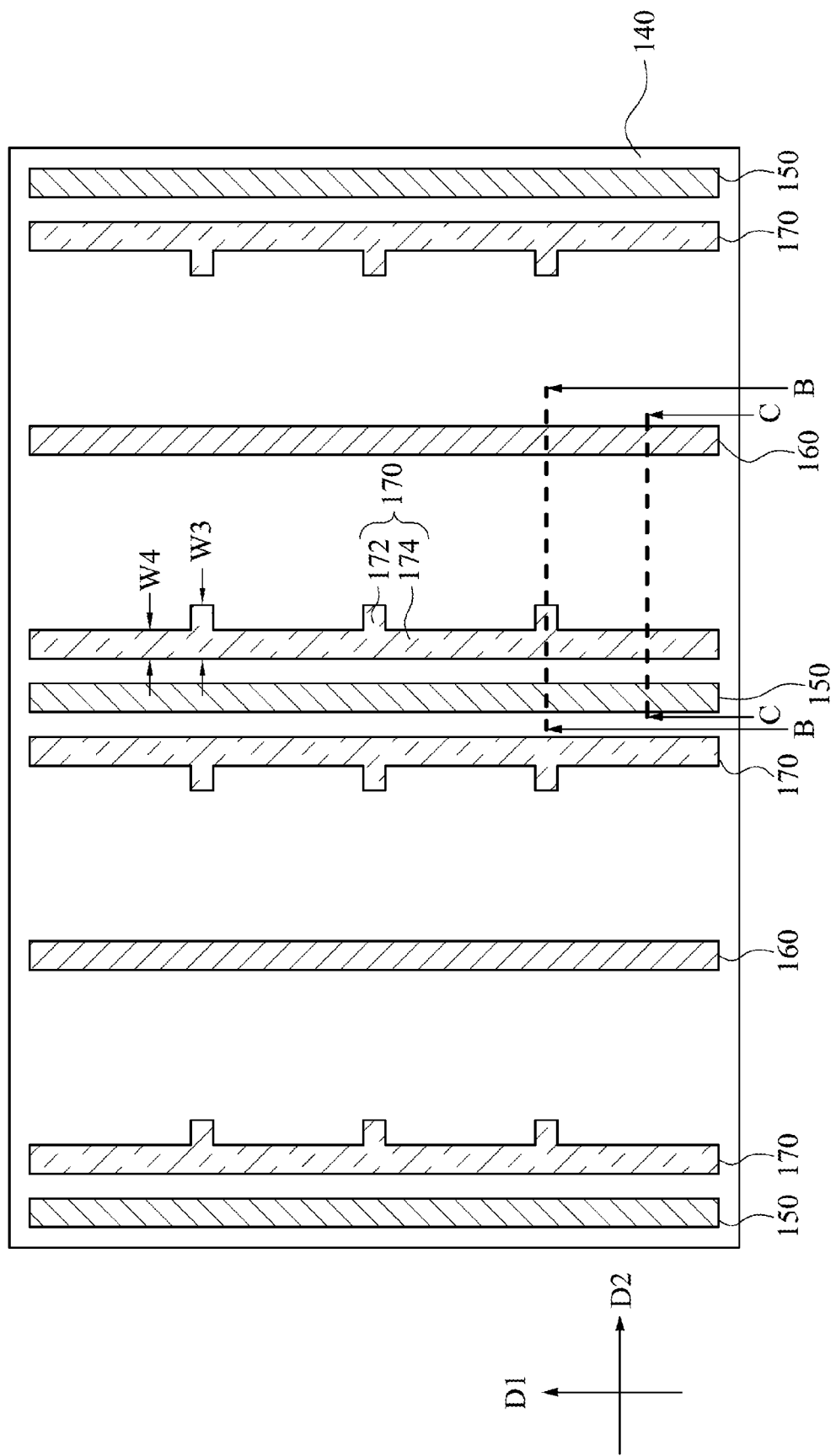

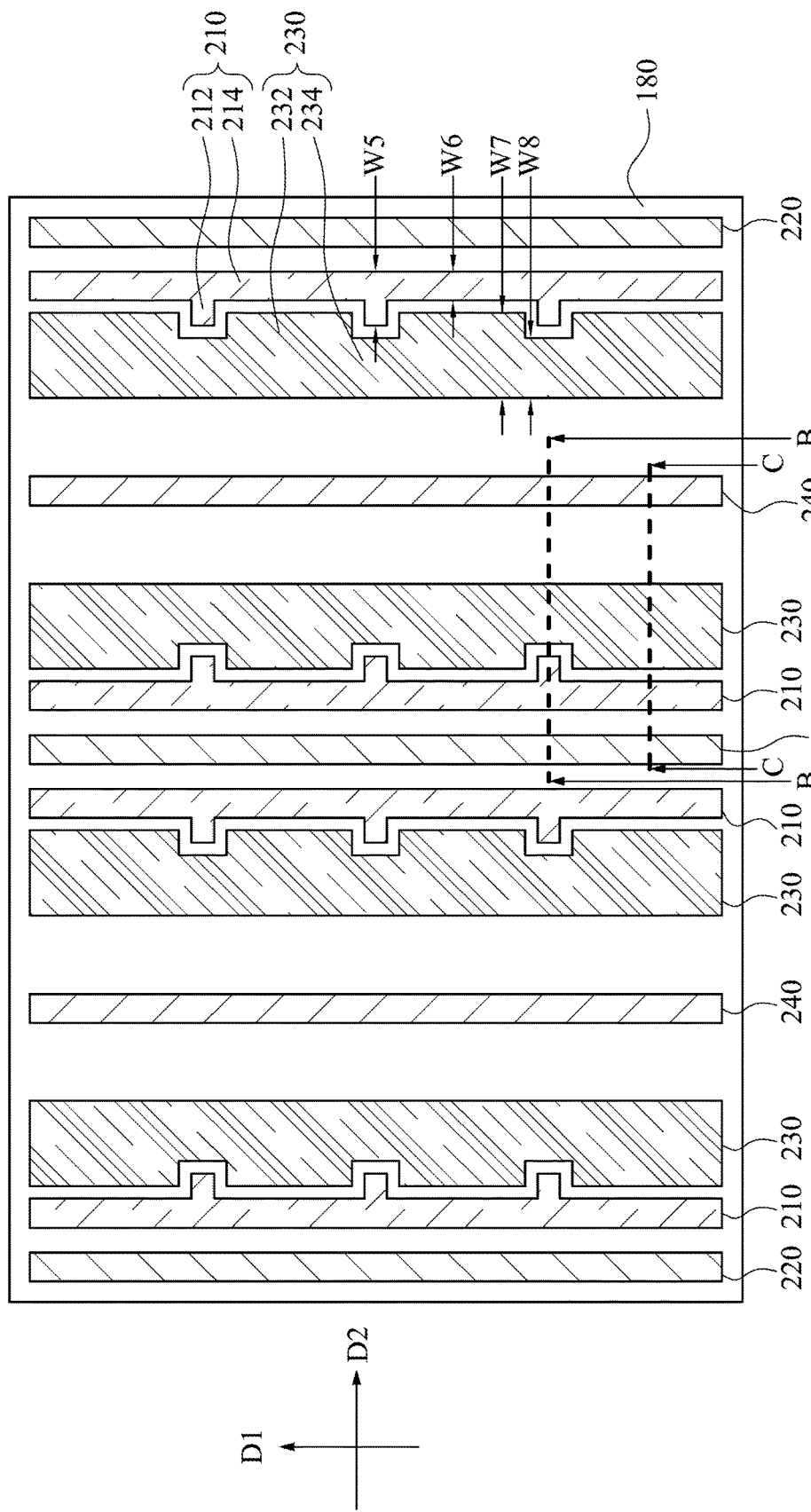

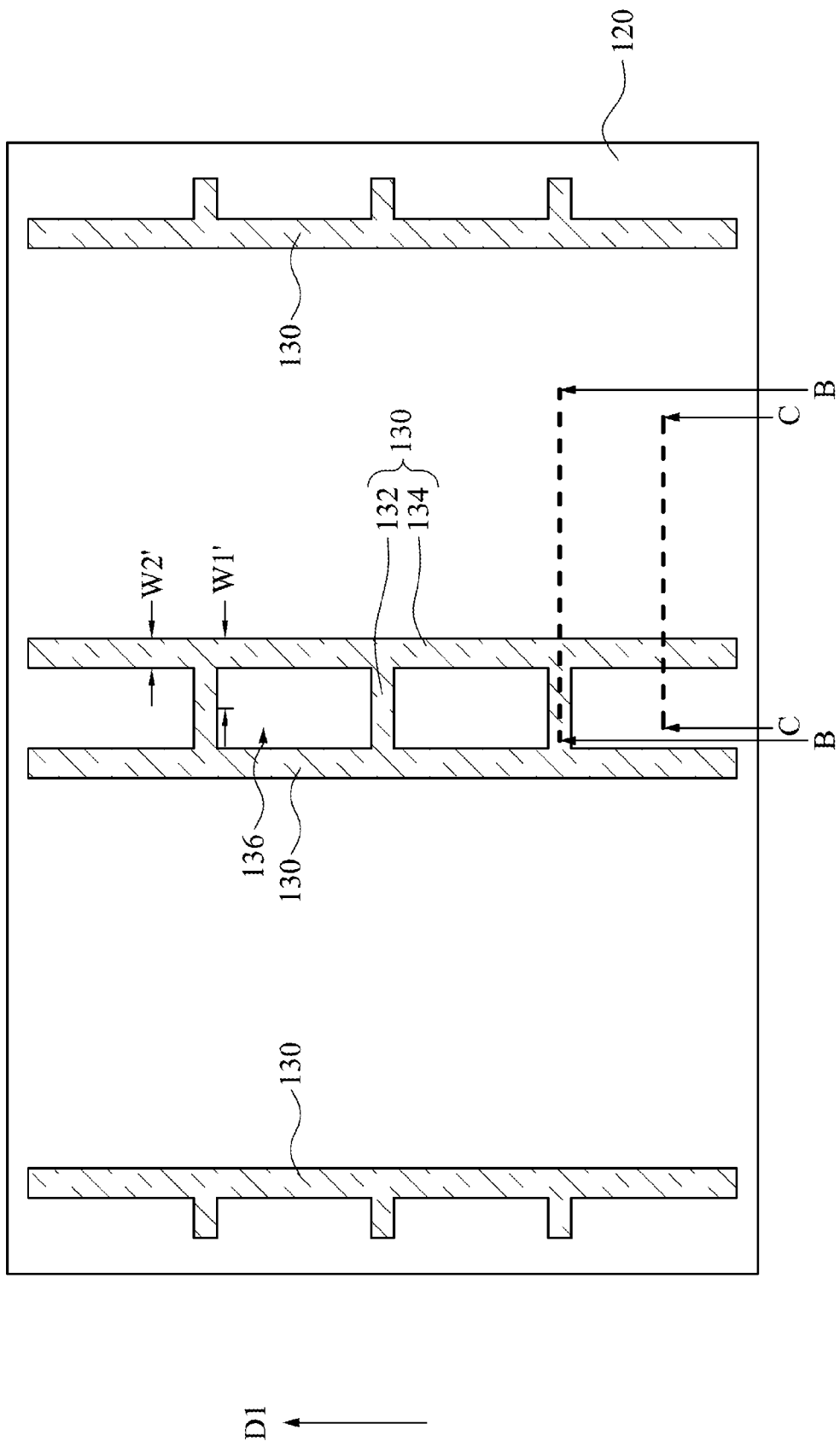

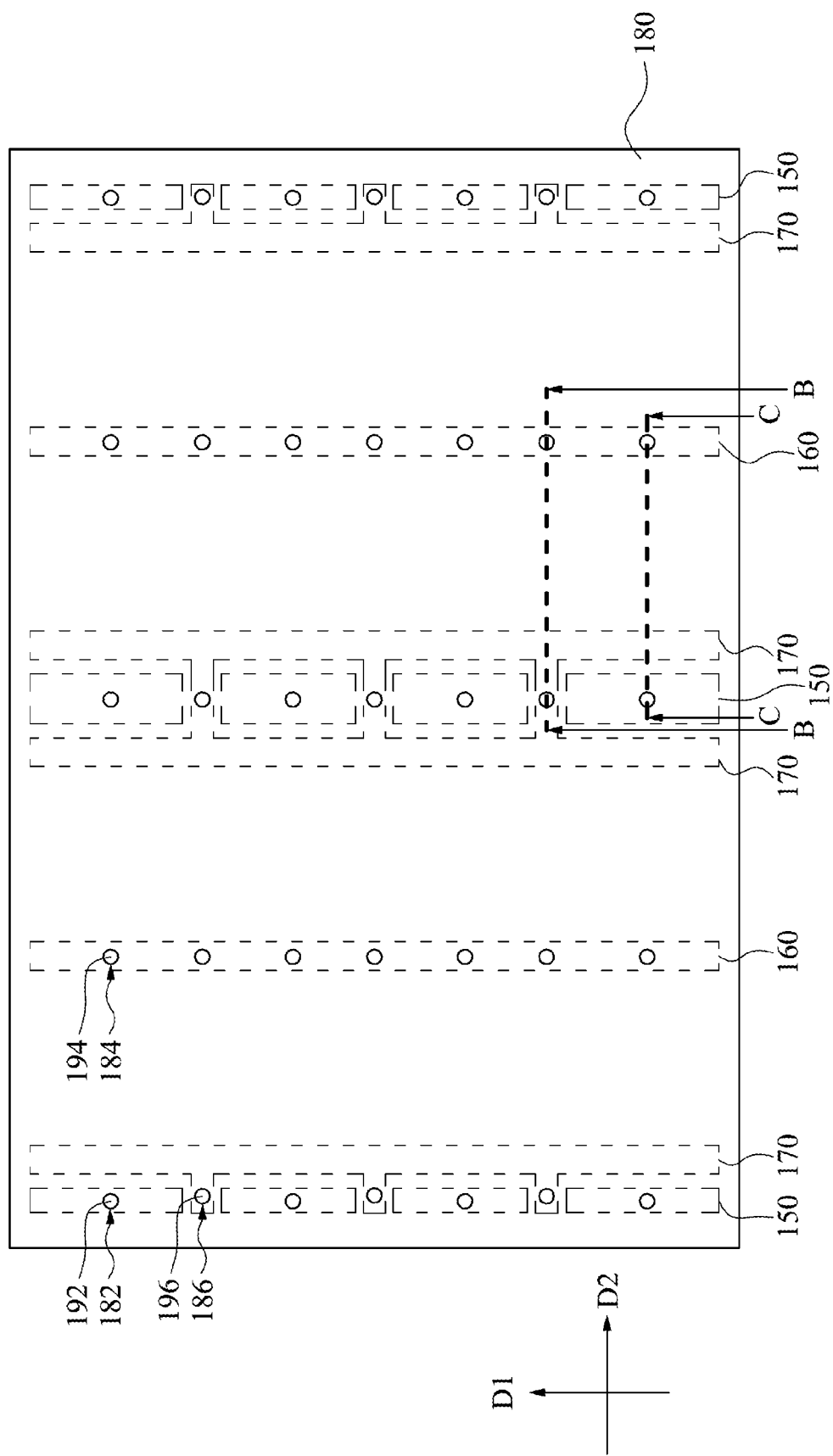

TRANSISTOR WITH A GATE METAL LAYER HAVING VARYING WIDTH

BACKGROUND

Field of Disclosure

The present disclosure relates to a semiconductor device. More particularly, the present disclosure relates to a high electron mobility transistor (HEMT).

Description of Related Art

A nitride semiconductor has high electric breakdown field and high electron saturation velocity. Thus, the nitride semiconductor is expected to be a semiconductor material for semiconductor devices having high breakdown voltage and low on-state resistance. Many of the conventional semiconductor devices using the nitride related materials may have heterojunctions. The heterojunction is configured with two types of nitride semiconductors having different bandgap energies from each other and is able to generate a two-dimensional electron gas layer (2DEG layer) near the junction plane. The semiconductor devices having the heterojunction may achieve a low on-state resistance. These types of semiconductor devices are called high electron mobility transistors (HEMT).

SUMMARY

An aspect of the present disclosure provides a semiconductor device including an active layer, at least one source electrode, at least one drain electrode, at least one gate electrode, a first insulating layer, at least one gate metal layer, at least one via, at least one first source metal layer, at least one drain metal layer, and at least one second source metal layer. The source electrode, the drain electrode, and the gate electrode are present on the active layer. The gate electrode is present between the source electrode and the drain electrode. The first insulating layer is present on the source electrode, the drain electrode, and the gate electrode. The gate metal layer is present on the gate electrode and the first insulating layer. The gate metal layer includes at least one narrow portion and at least one wider portion. The via is present between the gate metal layer and the gate electrode. The first source metal layer is present on the source electrode and the first insulating layer. The drain metal layer is present on the drain electrode and the first insulating layer. The second source metal layer is present on the first insulating layer and between the gate metal layer and the drain metal layer.

In some embodiments, the narrow portion and the wider portion of the gate metal layer are alternately arranged along a direction, and the gate metal layer, the first source metal layer, the second source metal layer, and the drain metal layer substantially extend along the direction.

In some embodiments, the gate metal layer, the first source metal layer, the second source metal layer, and the drain metal layer are present on the same level.

In some embodiments, the narrow portion and the wider portion of the gate metal layer are alternately arranged along a direction, and the gate metal layer and the gate electrode substantially extend along the direction.

In some embodiments, a part of the wider portion of the gate metal layer extends toward the drain metal layer.

In some embodiments, the second source metal layer includes at least one narrow portion and at least one wider portion. The narrow portion of the second source metal layer is adjacent to the wider portion of the gate metal layer, and the wider portion of the second source metal layer is adjacent to the narrow portion of the gate metal layer.

In some embodiments, a part of the wider portion of the gate metal layer extends toward the first source metal layer and is connected to the wider portion of another gate metal layer.

In some embodiments, the first source metal layer includes a plurality of source blocks spaced from each other.

In some embodiments, at least one of the source blocks is surrounded by the connected gate metal layers.

In some embodiments, the narrow portion and the wider portion of the gate metal layer are alternately arranged along a direction, and the gate electrode includes at least one narrow portion and at least one wider portion alternately arranged along the direction.

In some embodiments, a part of the wider portion of the gate electrode extends toward the drain electrode.

In some embodiments, a part of the wider portion of the gate electrode extends toward the source electrode and connected to the wider portion of another gate electrode.

In some embodiments, the source electrode includes a plurality of source blocks spaced from each other.

In some embodiments, the first source metal layer includes a plurality of source blocks spaced from each other, and the source blocks of the first source metal layer overlap the source blocks of the source electrode.

In some embodiments, the via is present between the wider portion of the gate metal layer and the wider portion of the gate electrode.

In some embodiments, the wider portion of the gate metal layer overlaps the wider portion of the gate electrode, and the narrow portion of the gate metal layer overlaps the narrow portion of the gate electrode.

In some embodiments, the semiconductor device further includes a second insulating layer, a source pad, and a drain pad. The second insulating layer is present on the gate metal layer, the first source metal layer, the second source metal layer, and the drain metal layer. The source pad is present on the second insulating layer and connected to the first source metal layer and the second source metal layer. The drain pad is present on the second insulating layer and connected to the drain metal layer.

In some embodiments, the first source metal layer includes a plurality of source blocks spaced from each other, and the source pad is connected to the source blocks.

In some embodiments, the via is present between the wider portion of the gate metal layer and the gate electrode.

In some embodiments, the via is present between the narrow portion of the gate metal layer and the gate electrode.

In some embodiments, the semiconductor device further includes a gate layer present between the gate electrode and the active layer, wherein the gate layer includes p-type material.

BRIEF DESCRIPTION OF THE DRAWINGS

FIGS. 1A to 7A are top views of a method for manufacturing a semiconductor device at different stages according to some embodiments of the present disclosure;

FIGS. 1B to 7B are cross-sectional views of the semiconductor device taking along lines B-B of FIGS. 1A to 6A;

FIGS. 1C to 7C are cross-sectional views of the semiconductor device taking along lines C-C of FIGS. 1A to 6A;

FIGS. 9A to 15A are top views of a method for manufacturing a semiconductor device at different stages according to some embodiments of the present disclosure;

FIGS. 9B to 15B are cross-sectional views of the semiconductor device taking along lines B-B of FIGS. 9A to 15A;

FIGS. 9C to 15C are cross-sectional views of the semiconductor device taking along lines C-C of FIGS. 9A to 15A.

DETAILED DESCRIPTION

Figure 1A:
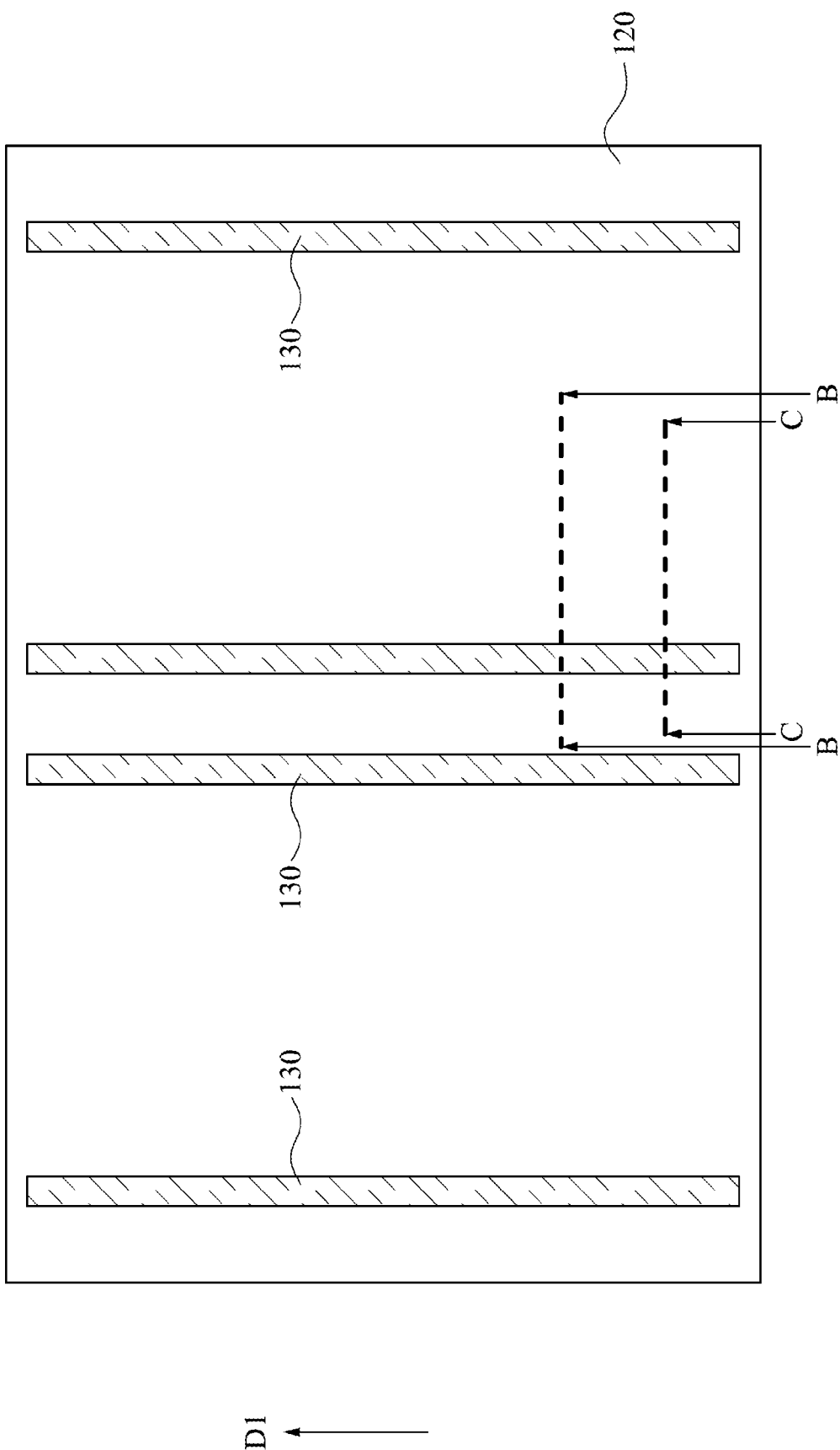

Reference will now be made in detail to the present embodiments of the disclosure, examples of which are illustrated in the accompanying drawings. Wherever possible, the same reference numbers are used in the drawings and the description to refer to the same or like parts.

Figure 1B:
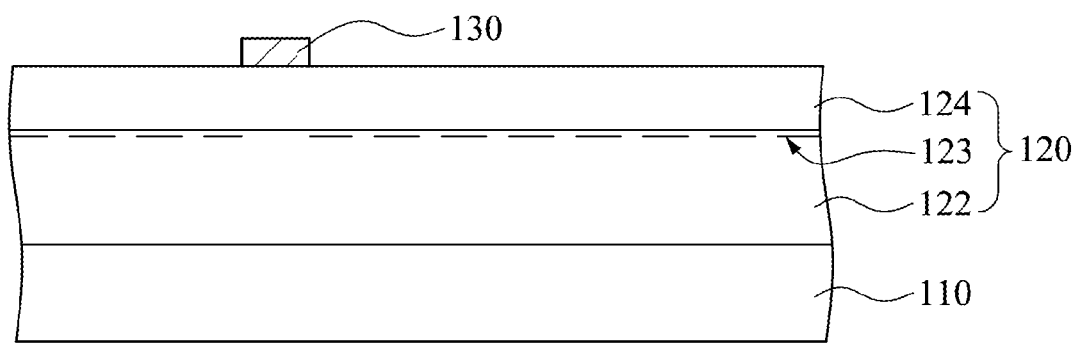
Figure 1C:
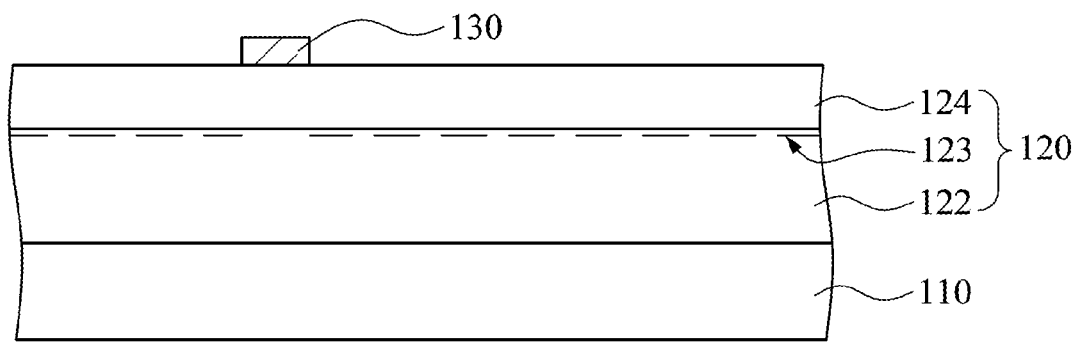

FIGS. 1A to 7A are top views of a method for manufacturing a semiconductor device at different stages according to some embodiments of the present disclosure, FIGS. 1B to 7B are cross-sectional views of the semiconductor device taking along lines B-B of FIGS. 1A to 7A, and FIGS. 1C to 7C are cross-sectional views of the semiconductor device taking along lines C-C of FIGS. 1A to 7A. Reference is made to FIGS. 1A, 1B, and 1C. A substrate 110 is provided. The substrate 110 can be any substrate suitable for the purposes discussed herein, such as silicon carbide, sapphire, silicon, aluminum nitride, gallium nitride, or zinc oxide. Although not shown in the FIGS. 1A, 1B and 1C, a transition layer or a nucleation layer can be formed on the substrate 110 to provide a base layer for proper epitaxial growth of device profile layers. The nucleation layer is specific to the type of substrate used.

An active layer 120 is formed on the substrate 110. The active layer 120 includes a buffer layer 122 and a barrier layer 124. The buffer layer 122 is disposed on the substrate 110, and the barrier layer 124 is disposed on the buffer layer 122. The buffer layer 122 can provide a uniform crystal structure for epitaxial deposition, and thus can be optionally included for improved device characteristics. In some embodiments, the buffer layer 122 can be a nitride based material to provide good adhesion for the layers formed thereon and also solve issues of lattice mismatch, but the present disclosure is not limited in this respect. The buffer layer 122 can be a single layer such as an $In_xAl_yGa_{1-x-y}N$ layer, or can be a composite layer. The barrier layer 124 can be made of materials having a larger band gap than the buffer layer 122, such as AlGaN. In some embodiments, the barrier layer 124 can be doped or undoped. A charge accumulates at the interface between the buffer layer 122 and the barrier layer 124 and creates a two dimensional electron gas (2DEG) 123. The 2DEG 123 has high electron mobility which gives the semiconductor device a high transconductance at high frequencies.

A plurality of gate layers 130 are formed on the substrate 110. For example, a semiconductor layer (not shown) is formed on the barrier layer 124, and is then patterned. The patterned semiconductor layers are doped to be the gate layers 130. The gate layer 130 includes p-type material.

Figure 2A:
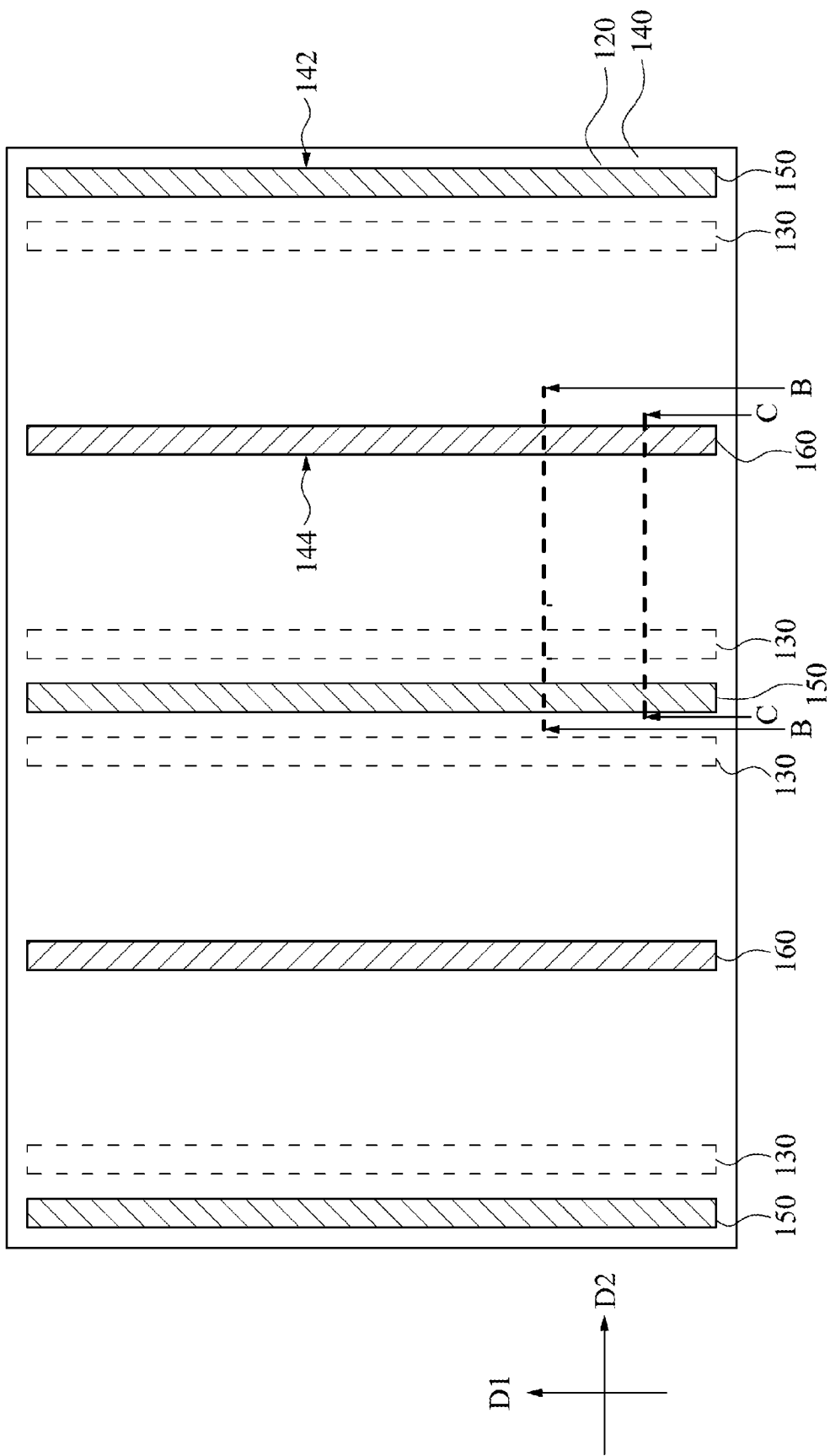
Figure 2B:
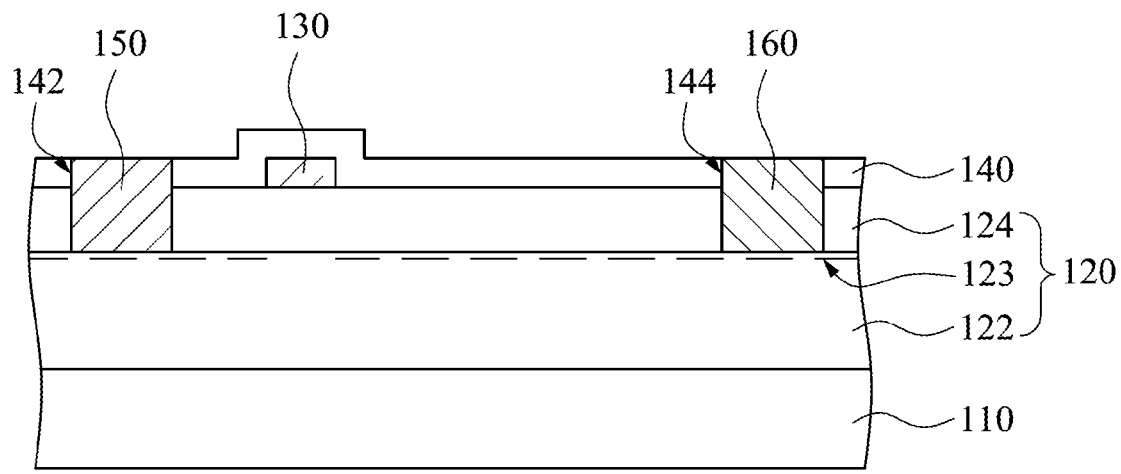
Figure 2C:
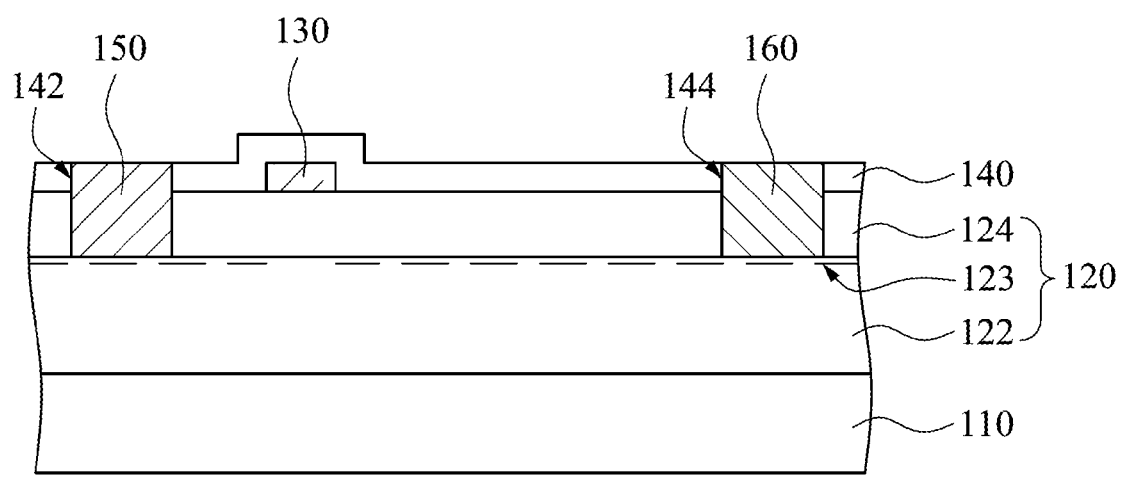

Reference is made to FIGS. 2A, 2B, and 2C. A passivation layer 140 is formed to cover the p-type layers 130 and the active layer 120. The passivation layer 140 may be made of dielectric materials, such as silicon nitride, silicon oxynitride or silicon dioxide. The passivation layer 140 and the barrier layer 124 of the active layer 120 are then patterned to form a plurality of first openings 142 and a plurality of second openings 144, and the gate layers 130 are respectively disposed between the first openings 142 and the second openings 144. The first openings 142 and the second openings 144 extend along the first direction D1 and respectively expose parts of the buffer layer 122.

A plurality of source electrodes 150 and a plurality of drain electrodes 160 are respectively formed in the first openings 142 and the second openings 144. That is, the source electrodes 150 and the drain electrodes 160 are alternately arranged along a second direction D2 different from the first direction. For example, the second direction D2 is substantially perpendicular to the first direction D1. In some embodiments, the source electrodes 150 and the drain electrodes 160 are made of conductive materials, such as metal, and the source electrodes 150 and the drain electrodes 160 are electrically connected to the 2DEG 123.

Figure 3B:
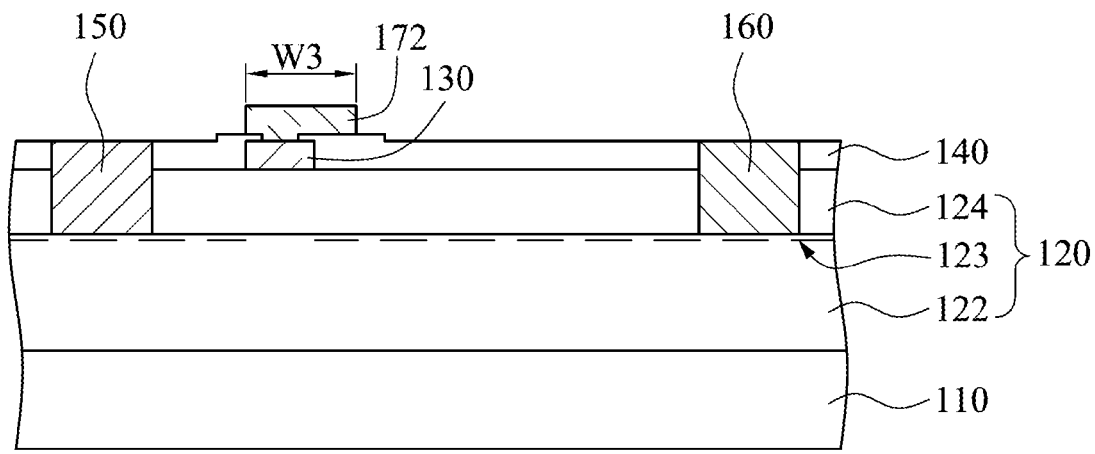
Figure 3C:
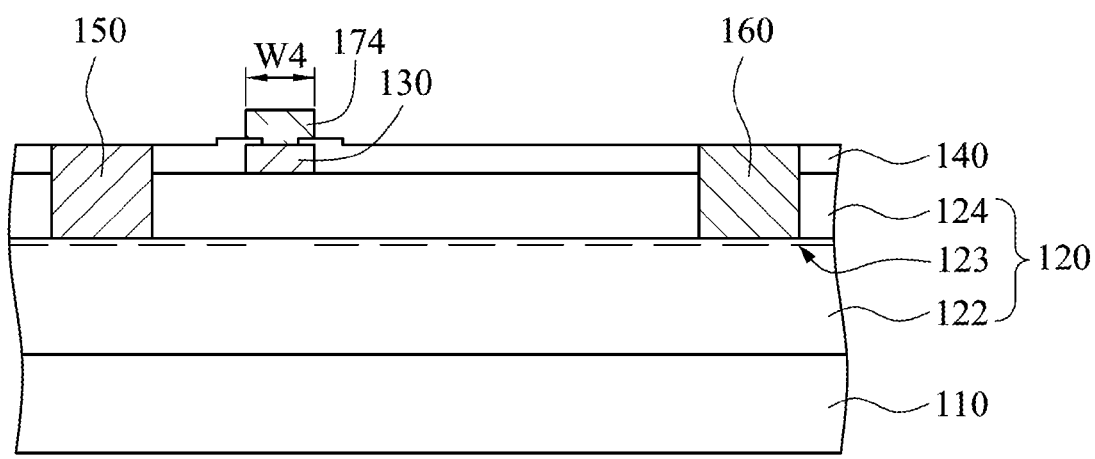

Reference is made to FIGS. 3A, 3B, and 3C. The passivation layer 140 is further patterned to expose the gate layers 130. Subsequently, a plurality of gate electrodes 170 are respectively formed on the gate layers 130. In some embodiments, the gate electrodes 170 are made of conductive materials, such as metal. The passivation layer 140 can prevent the current leakage. At least one of the gate electrodes 170 includes at least one wider portion 172 and at least one narrow portion 174 alternately arranged along the first direction D1. The width W3 of the wider portion 172 is wider than the width W4 of the narrow portion 174. For example, in FIG. 3A, one of the gate electrodes 170 includes three of the wider portions 172 and four of the narrow portions 174. Parts of the wider portions 174 of the gate electrodes 170 extend toward the adjacent drain electrodes 160. In some embodiments, the gate electrodes 170 and the gate layers 130 have different patterns as shown in FIGS. 1A and 3A. However, in some other embodiments, the gate electrodes 170 and the gate layers 130 have the substantially same or similar patterns. That is, the gate layers 130 may include wider portions and narrow portions. An embodiment falls within the claimed scope as long as the gate electrodes 170 overlap the gate layers 130. In some embodiments, the thickness of the gate electrodes 170 is about 100 nm to about 200 nm.

Figure 4A:
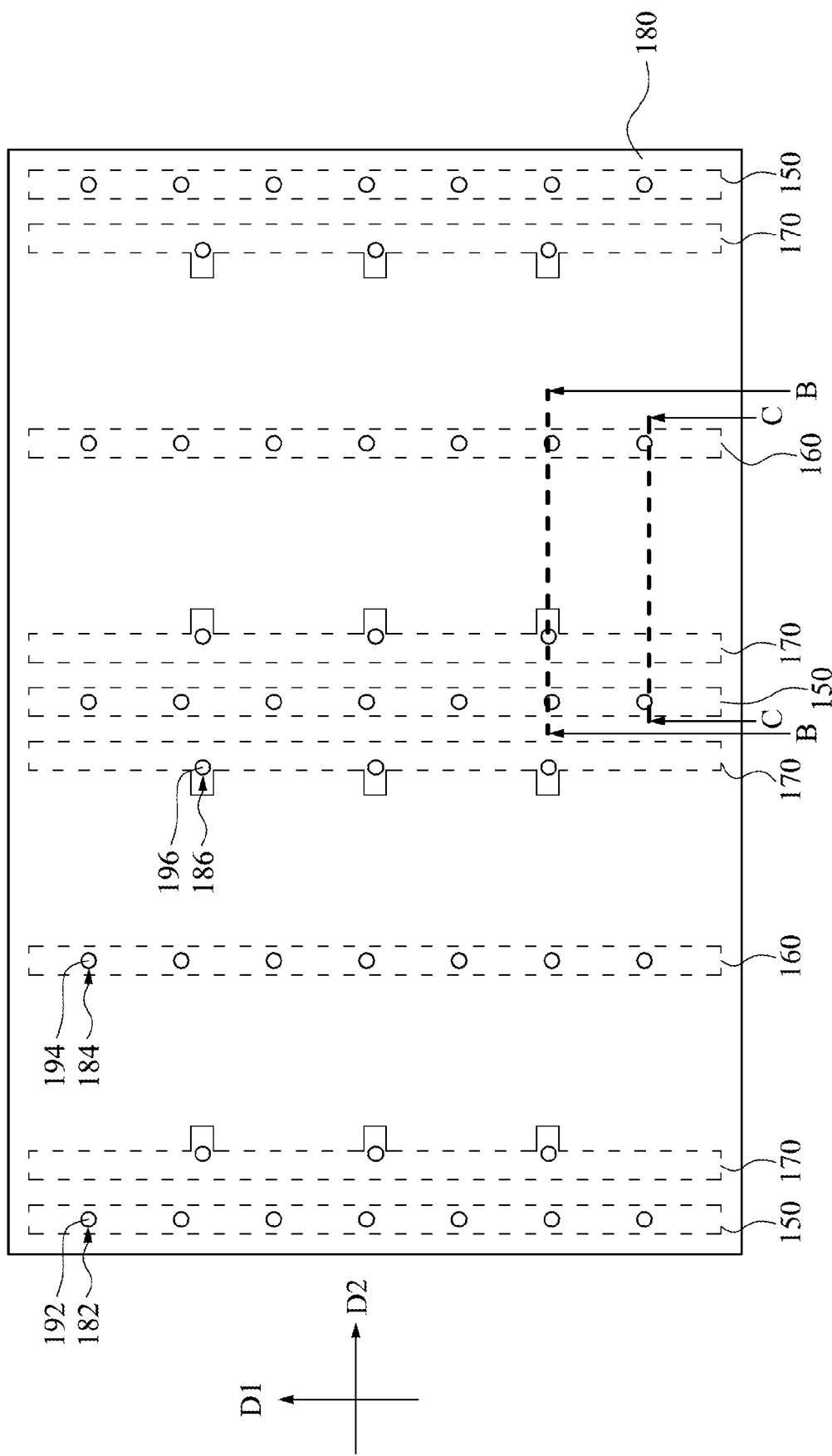
Figure 4B:
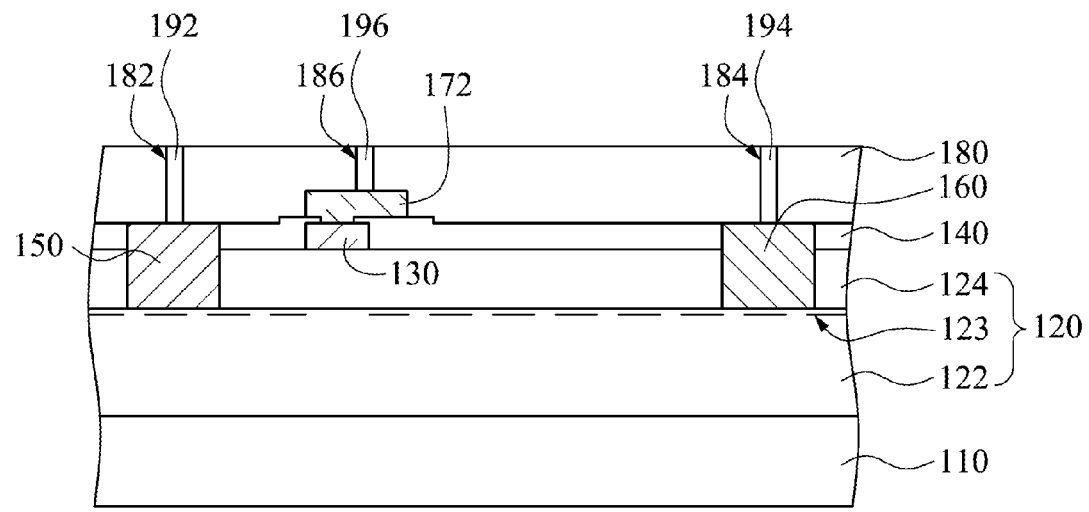
Figure 4C:
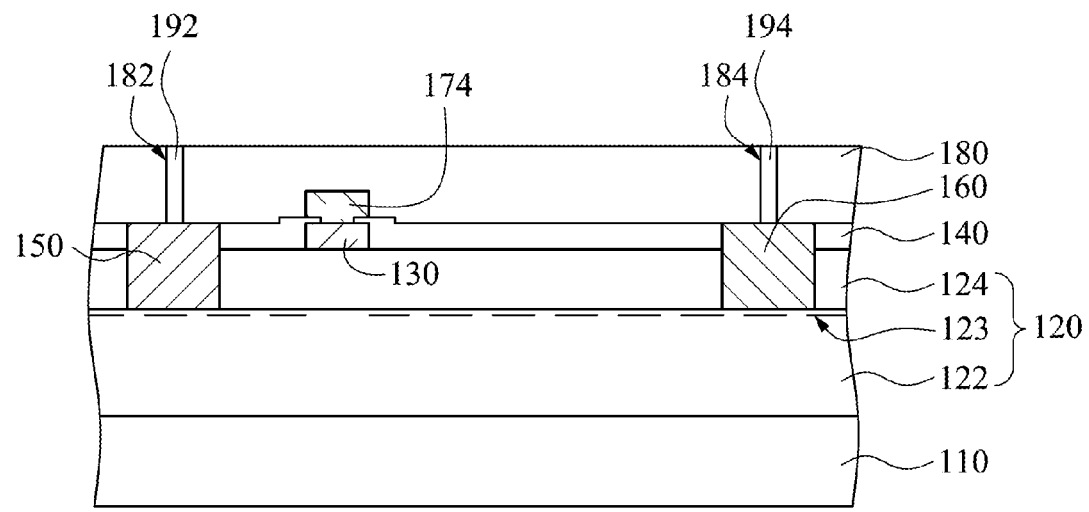

Reference is made to FIGS. 4A, 4B, and 4C. A first insulating layer 180 is formed to cover the source electrodes 150, the drain electrodes 160, and the gate electrodes 170. The first insulating layer 180 can be made of dielectric layer, such as silicon nitride, silicon oxynitride or silicon dioxide. Subsequently, a plurality of through holes 182, 184, and 186 are formed in the first insulating layer 180. The through holes 182 expose the source electrodes 150, the through holes 184 expose the drain electrodes 160, and the through holes 186 expose the gate electrodes 170. In some embodiments, the through holes 186 are formed on the wider portions 172 of the gate electrodes 170. Then, vias 192, 194, and 196 are respectively formed in the through holes 182, 184, and 186. That is, the vias 192 are present on the source electrodes 150, the vias 194 are present on the drain electrodes 160, and the vias 196 are present on the gate electrodes 170.

Figure 5B:
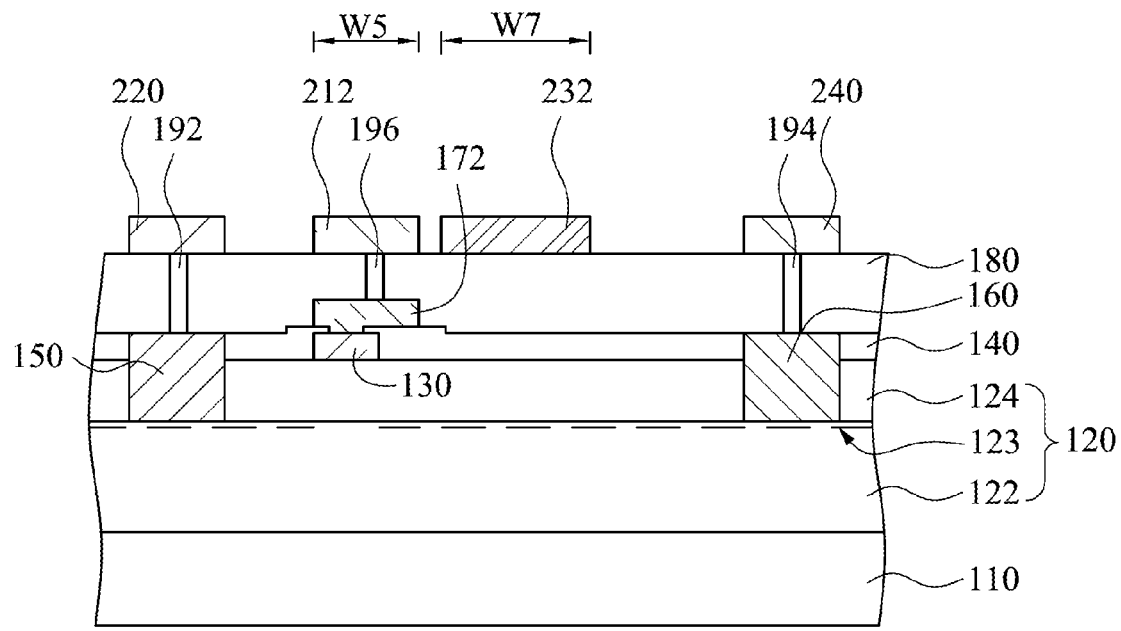
Figure 5C:
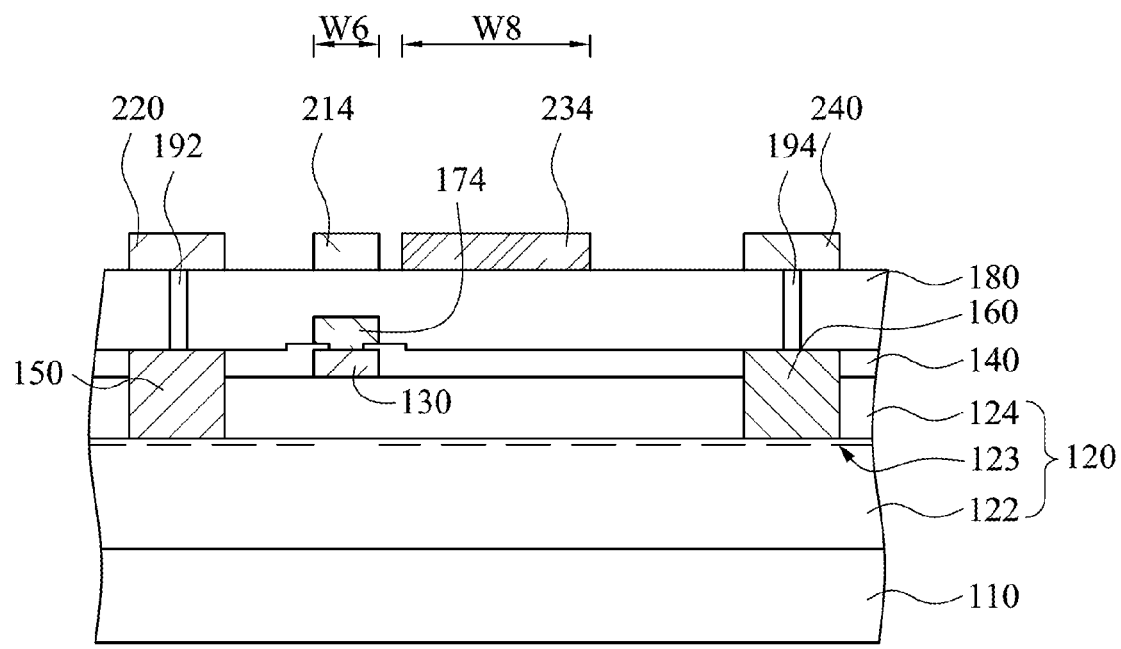

Reference is made to FIGS. 5A, 5B, and 5C. A metal layer (not shown) is formed on the first insulating layer 180 and is patterned to be a plurality of gate metal layers 210, a plurality of first source metal layers 220, a plurality of second source metal layers 230, and a plurality of drain metal layers 240. That is, the gate metal layers 210, the first source metal layers 220, the second source metal layers 230, and the drain metal layers 240 are present on the same level.

In greater detail, the gate metal layers 210 are respectively formed above the gate electrodes 170. That is, the vias 196 are connected to the wider portions 172 of the gate electrodes 170 and the gate metal layers 210. At least one of the gate metal layers 210 includes at least one wider portion 212 and at least one narrow portion 214 alternately arranged along the first direction D1. The width W5 of the wider portion 212 is wider than the width W6 of the narrow portion 214. For example, in FIG. 5A, one of the gate metal layers 210 includes three of the wider portions 212 and four of the narrow portions 214. Parts of the wider portions 214 of the gate metal layers 210 extend toward the drain metal layers 240. In some embodiments, the gate metal layers 210 and the gate electrodes 170 have the substantially same or similar patterns. For example, in FIG. 5A, the gate metal layers 210 and the gate electrodes 170 (see FIG. 3A) have the substantially same pattern. That is, the gate metal layers 210 and the gate electrodes 170 substantially extend along the first direction D1. However, in some other embodiments, the gate metal layers 210 and the gate electrodes 170 have different patterns. An embodiment falls within the claimed scope as long as the gate metal layers 210 overlap the gate electrodes 170. For example, the wider portions 212 of the gate metal layers 210 overlap the wider portions 172 of the gate electrodes 170, and the narrow portions 214 of the gate metal layers 210 overlap the narrow portions 174 of the gate electrodes 170. The vias 196 are disposed between the wider portions 212 of the gate metal layers 210 and the wider portions 172 of the gate electrodes 170. In some embodiments, the thickness of the metal layer is about 1500 nm.

Since the gate metal layers 210 are connected to the gate electrodes 170, the resistance of the whole gate (the gate electrodes 170 and the gate metal layers 210) of the semiconductor device can be reduced. Furthermore, the vias 196 are disposed between the wider portions 212 of the gate metal layers 210 and the wider portions 172 of the gate electrodes 170. The wider portions 172 of the gate electrodes 170 have flat top surface, such that the formation of the vias 196 can be improved, and the vias 196 provide good connection between the gate metal layers 210 and the gate electrodes 170.

The first source metal layers 220 are respectively formed above the source electrodes 150. That is, the vias 192 are disposed between and connected to the source electrodes 150 and the first source metal layers 220. In some embodiments, the first source metal layers 220 and the source electrodes 150 have the substantially same or similar patterns. For example, in FIG. 5A, the first source metal layers 220 and the source electrodes 150 (see FIG. 3A) have the substantially same pattern. However, in some other embodiments, the first source metal layers 220 and the source electrodes 150 have different patterns. An embodiment falls within the claimed scope as long as the first source metal layers 220 overlap the source electrodes 150.

The drain metal layers 240 are respectively formed above the drain electrodes 160. That is, the vias 194 are disposed between and connected to the drain electrodes 160 and the drain metal layers 240. In some embodiments, the drain metal layers 240 and the drain electrodes 160 have the substantially same or similar patterns. For example, in FIG. 5A, the drain metal layers 240 and the drain electrodes 160 (see FIG. 3A) have the substantially same pattern. However, in some other embodiments, the drain metal layers 240 and the drain electrodes 160 have different patterns. An embodiment falls within the claimed scope as long as the drain metal layers 240 overlap the drain electrodes 160.

The second source metal layers 230 are disposed on the first insulating layer 180 and respectively between the gate metal layers 210 and the drain metal layers 240. The second source metal layers 230 are configured to disperse the electrical field of the semiconductor device to increase the breakdown voltage. At least one of the second metal layers 230 includes at least one wider portion 232 and at least one narrow portion 234 alternately arranged along the first direction D1. The width W7 of the wider portion 232 is wider than the width W8 of the narrow portion 234. For example, in FIG. 5A, one of the second source metal layers 230 includes four of the wider portions 232 and three of the narrow portions 234. Parts of the wider portions 234 of the second source metal layers 230 extend toward the adjacent gate metal layers 210. In some embodiments, the wider portions 212 of the gate metal layers 210 are adjacent to the narrow portions 234 of the second source metal layer 230, and the narrow portions 214 of the gate metal layers 210 are adjacent to the wider portions 232 of the second source metal layer 230. In FIG. 5A, the gate metal layers 210, the first source metal layers 220, the second source metal layers 230, and the drain metal layers 240 substantially extend along the first direction D1.

Figure 6A:
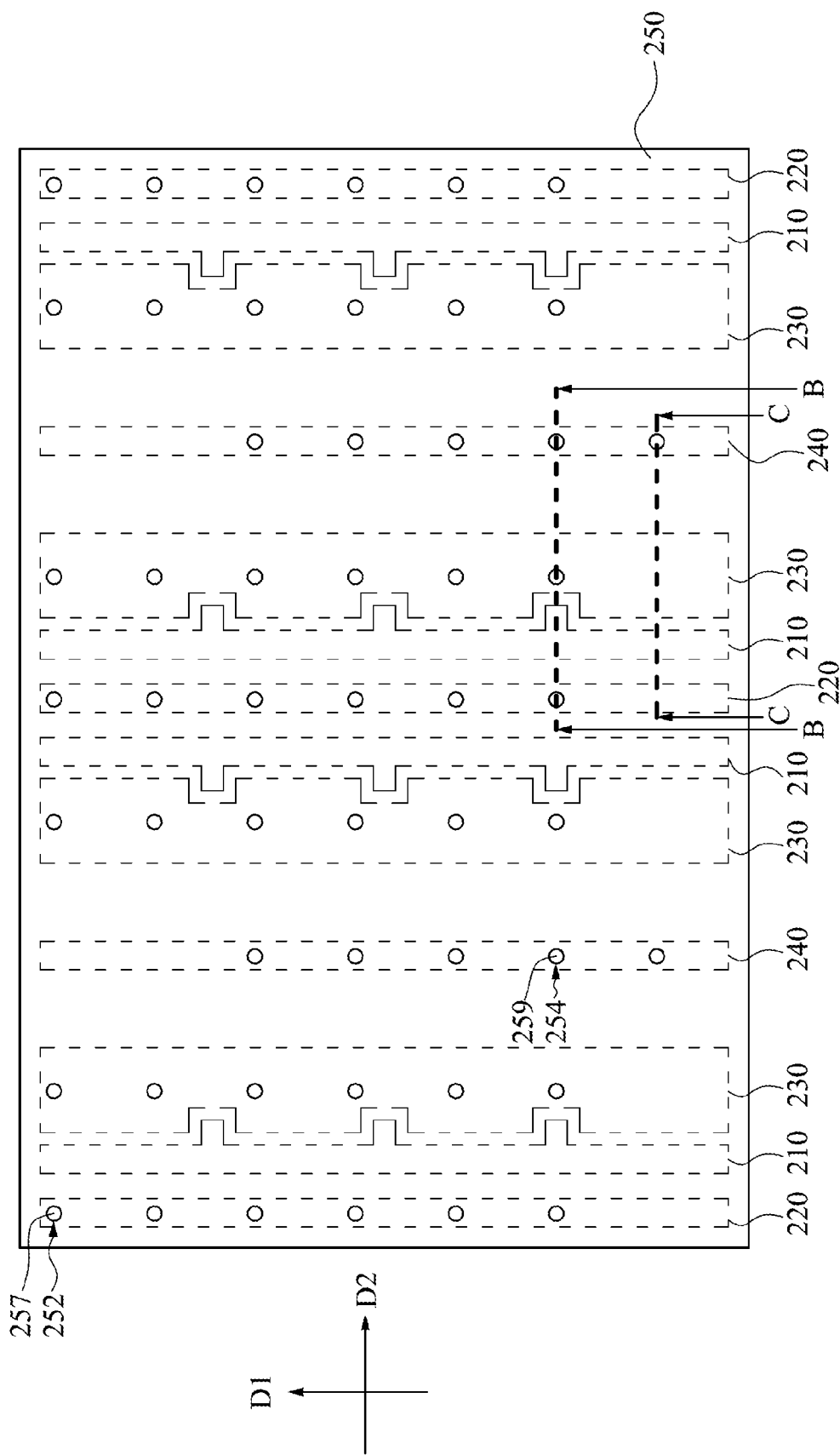
Figure 6B:
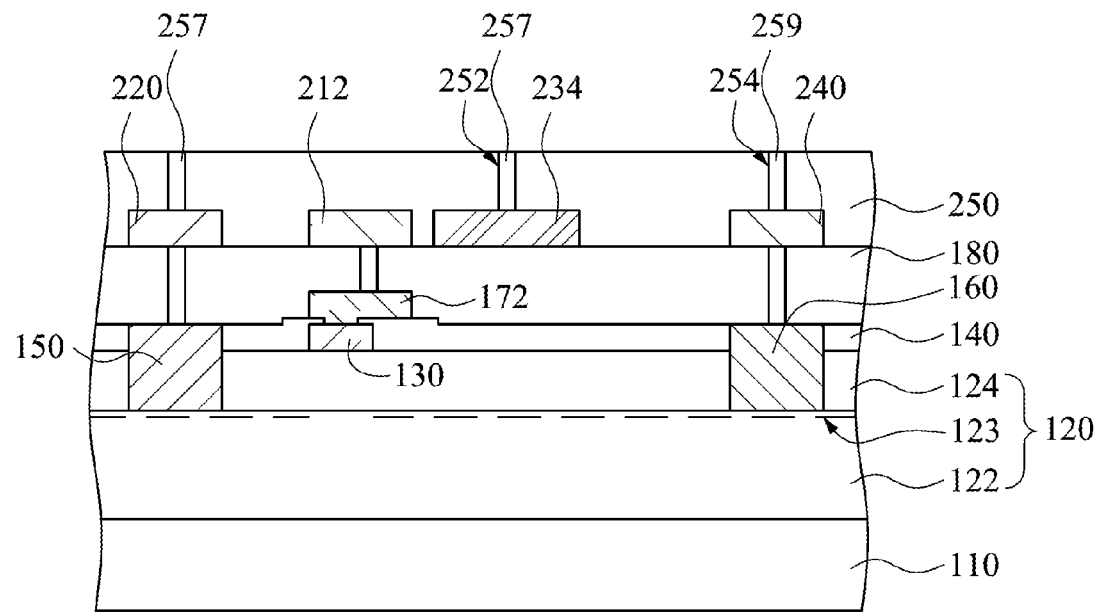
Figure 6C:
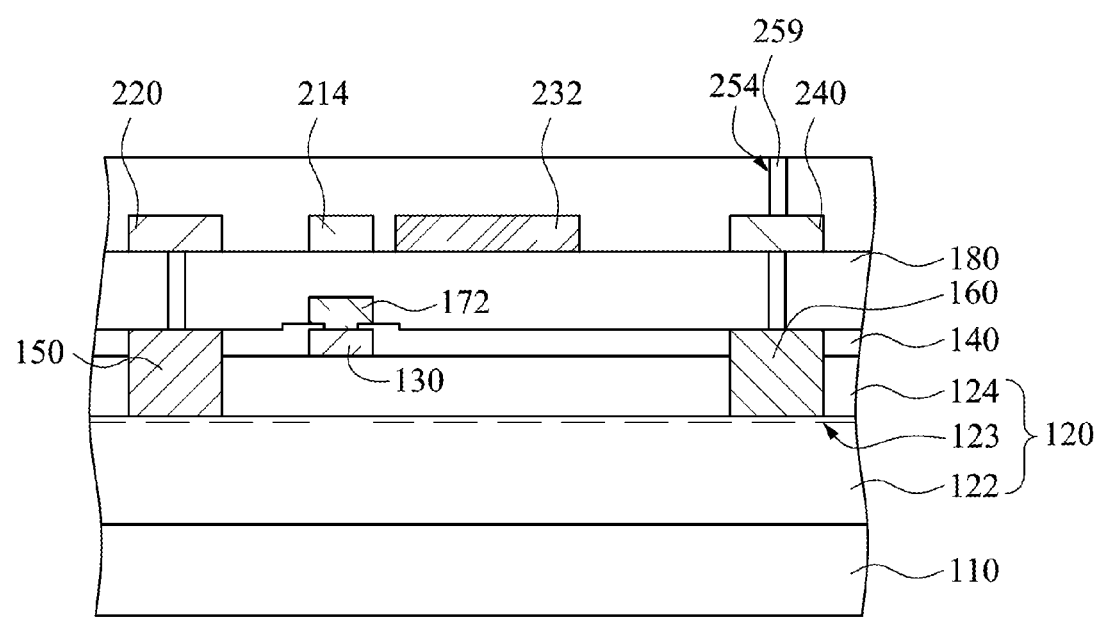

Reference is made to FIGS. 6A, 6B, and 6C. A second insulating layer 250 is formed to cover the gate metal layers 210, the first source metal layers 220, the second source metal layers 230, and the drain metal layers 240. The second insulating layer 250 can be made of dielectric layer, such as silicon nitride, silicon oxynitride or silicon dioxide. Subsequently, a plurality of through holes 252 and 254 are formed in the second insulating layer 250. The through holes 252 expose the first source metal layers 220 and the second source metal layers 230, and the through holes 254 expose the drain metal layers 240. Then, vias 257 and 259 are respectively formed in the through holes 252 and 254. That is, the vias 257 are present on the first source metal layers 220 and the second source metal layers 230, and the vias 259 are present on the drain metal layers 240.

Figure 7A:
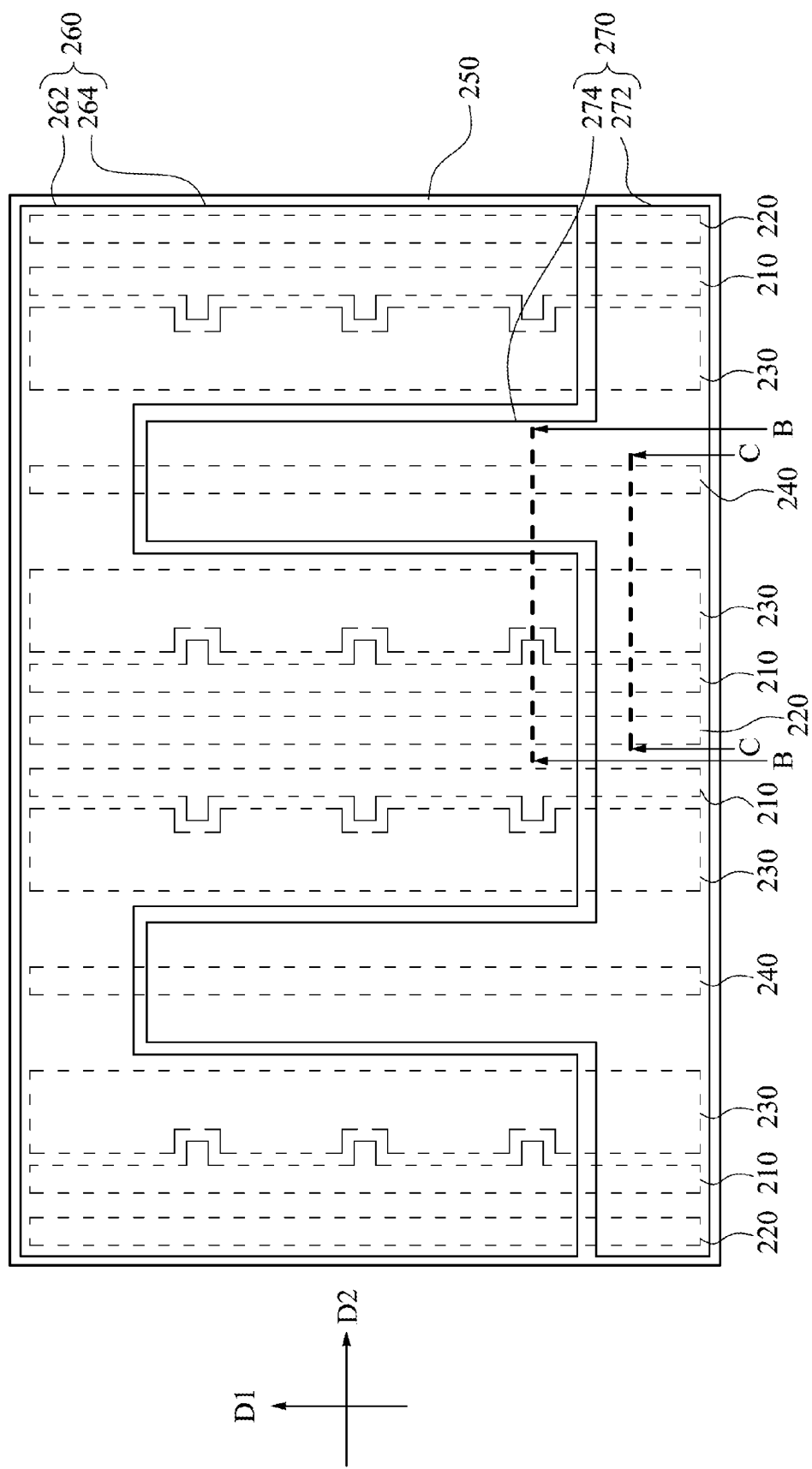
Figure 7B:
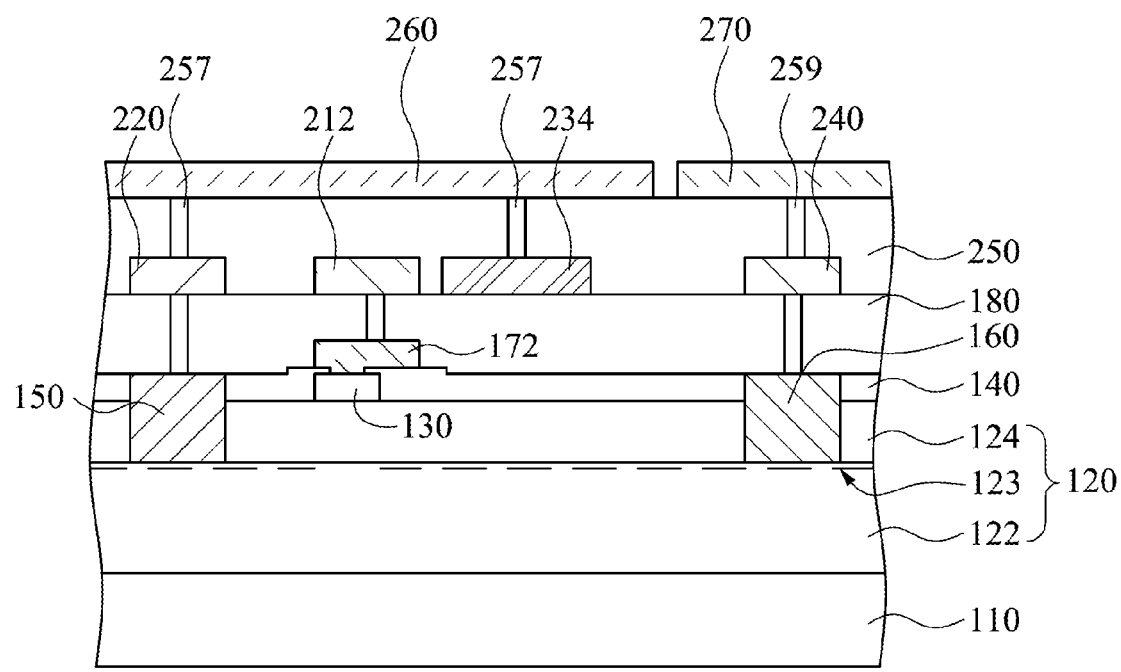
Figure 7C:
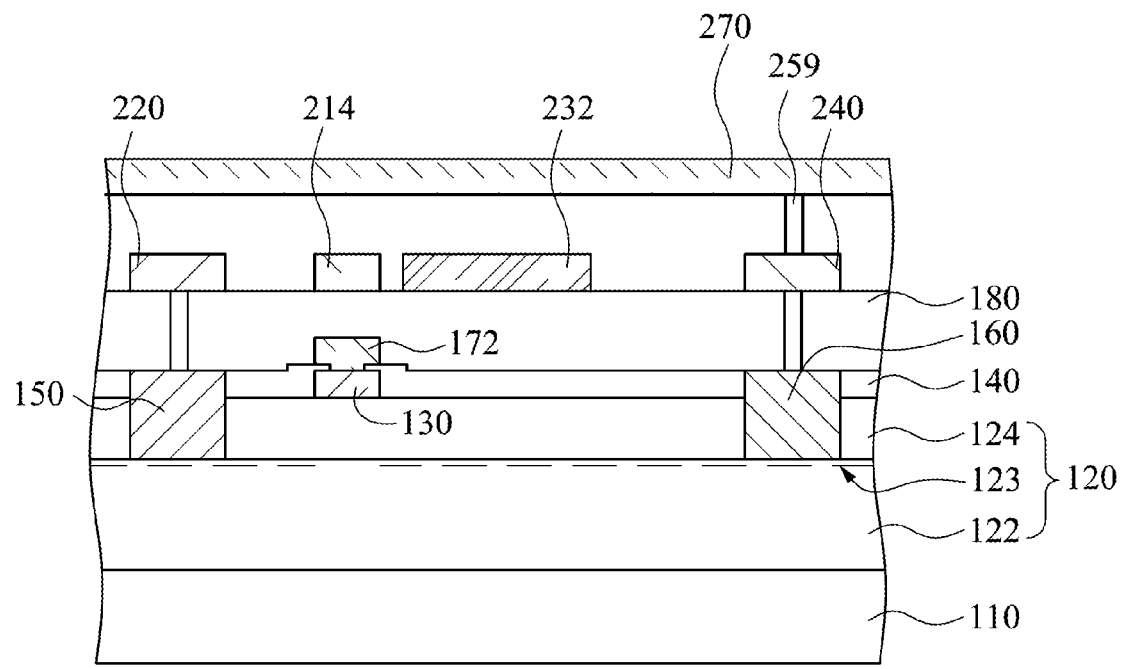

Reference is made to FIGS. 7A, 7B, and 7C. Another metal layer (not shown) is formed on the second insulating layer 250 and is patterned to be a source pad 260 and a drain pad 270. That is, the source pad 260 and the drain pad 270 are present on the same level. In some embodiments, the source pad 260 includes a main body 262 and at least one branch 264. For example, in FIG. 7A, there are three of the branches 264. The main body 262 extends along the second direction D2 while the branches 264 extend along the first direction D1. The branches 264 are disposed above the first source metal layers 220 and the second source metal layers 230. The vias 257 are disposed between and connected to the source pad 260 and the first source metal layers 220/the second source metal layers 230. In some embodiments, the drain pad 270 includes a main body 272 and at least one branch 274. For example, in FIG. 7A, there are two of the branches 274. The main body 272 extends along the second direction D2 while the branches 274 extend along the first direction D1. The branches 264 of the source pad 260 and the branches 274 of the drain pad 270 are alternately arranged along the second direction D2. The branches 274 are disposed above the drain metal layers 240. The vias 259 are disposed between and connected to the drain pad 270 and the drain metal layers 240. It is noted that the patterns of the source pad 260 and the drain pad 270 are illustrative, and should not limit the claimed scope of the present disclosure. A person having ordinary skill in the art may design suitable patterns for the source pad 260 and the drain pad 270 according to actual situations. In some embodiments, the semiconductor device further includes a gate pad (not shown), and the gate pad is electrically connected to the gate metal layers 210 and/or the gate electrodes 170.

Figure 8:
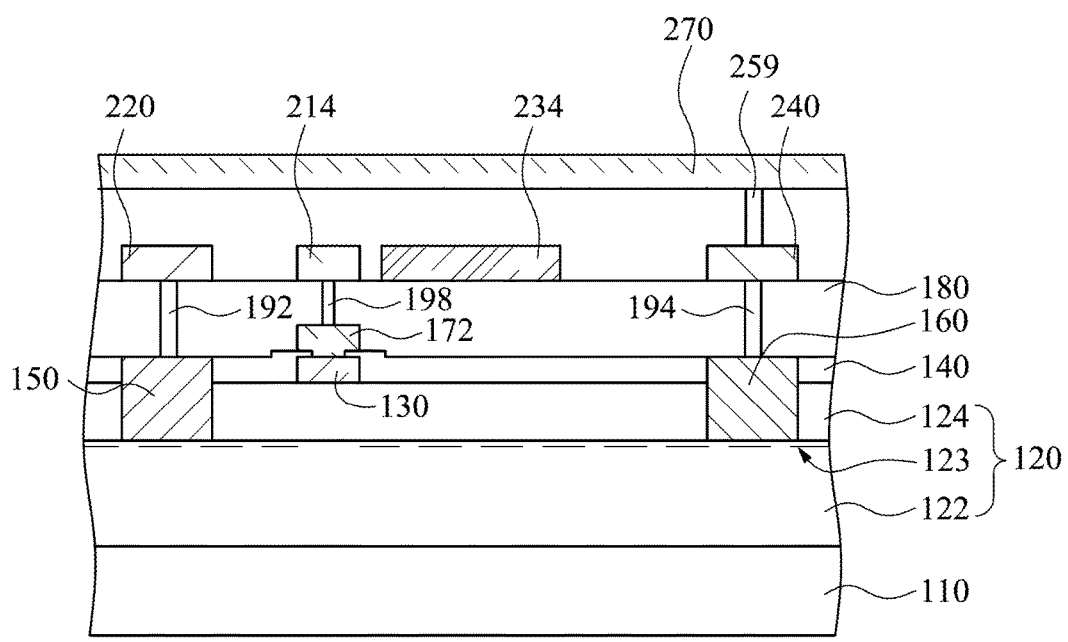
FIG. 8 is a cross sectional view of a semiconductor device according to some embodiments.

FIG. 8 is a cross sectional view of a semiconductor device according to some embodiments. The position of the cross sectional view of FIG. 8 is the same as the position of the cross sectional view of FIG. 7C. In FIG. 8, the semiconductor device further includes vias 198 disposed in the first insulating layer 180 and connected to the narrow portion 174 of the gate electrode 170 and the narrow portion 214 of the gate metal layer 210. With this configuration, the resistance of the whole gate (the gate electrodes 170 and the gate metal layers 210) can be further reduced. Other relevant structural details of the semiconductor device of FIG. 8 are similar to the semiconductor device of FIG. 7C, and, therefore, a description in this regard will not be repeated hereinafter.

Figure 9B:
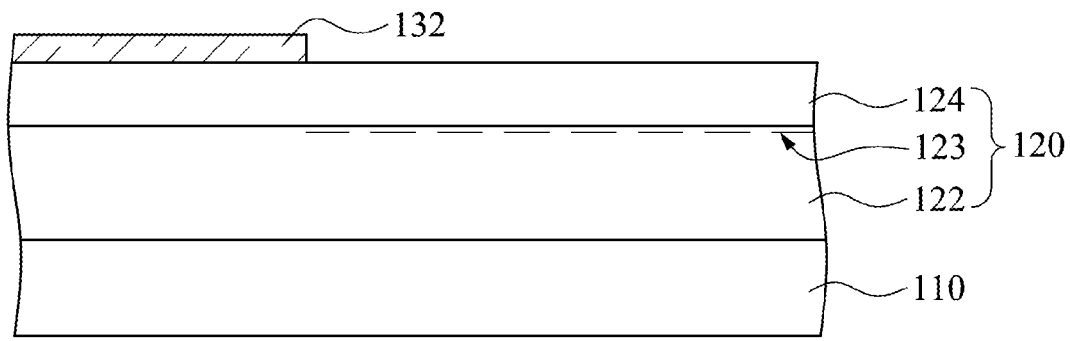
Figure 9C:
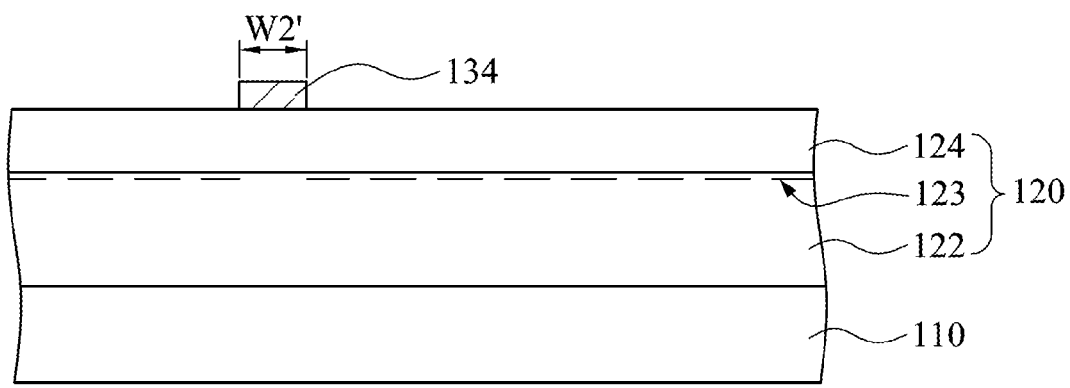

FIGS. 9A to 15A are top views of a method for manufacturing a semiconductor device at different stages according to some embodiments of the present disclosure, FIGS. 9B to 15B are cross-sectional views of the semiconductor device taking along lines B-B of FIGS. 9A to 15A, and FIGS. 9C to 15C are cross-sectional views of the semiconductor device taking along lines C-C of FIGS. 9A to 15A. It should be understood that the details of foregoing manufacturing method of the semiconductor device are similar to the manufacturing method of FIGS. 1A to 7C, and thus will not be described in detail in the following, and only the variations in the following embodiments will be described. Reference is made to FIGS. 9A, 9B, and 9C. A substrate 110 is provided. An active layer 120 is formed on the substrate 110. A plurality of gate layers 130 are formed on the substrate 110. At least one of the gate layers 130 includes at least one wider portion 132 and at least one narrow portion 134 alternately arranged along the first direction D1. The width W1' of the wider portion 132 is wider than the width W2' of the narrow portion 134. For example, in FIG. 9A, one of the gate layers 130 includes three of the wider portions 132 and four of the narrow portions 134. Two of the wider portions 132 of adjacent two gate layers 130 are connected, such that the adjacent two gate layers 130 form a plurality of accommodating spaces 136 separated from each other by the wider portions 132 of the gate layers 130.

Figure 10A:
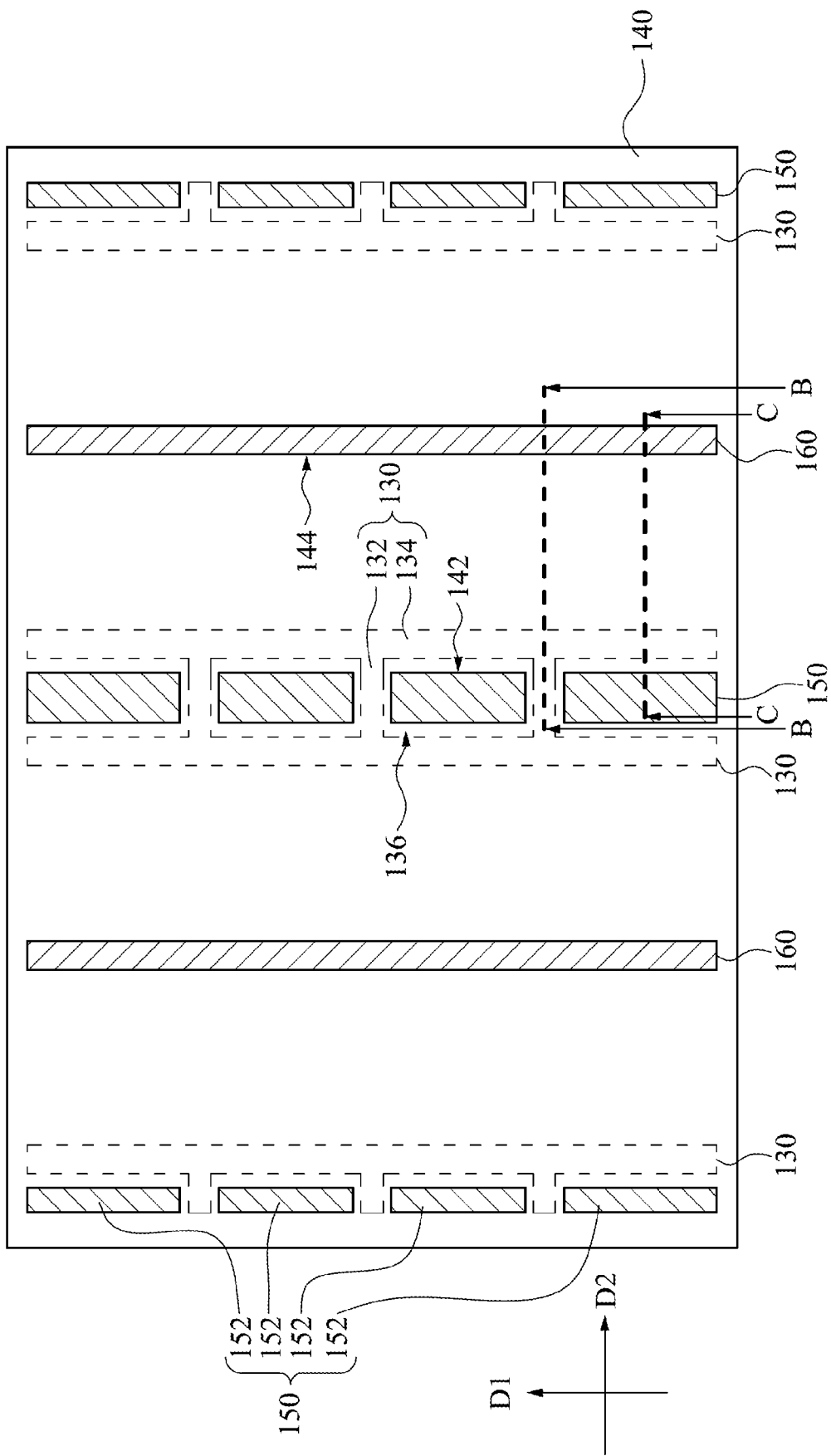
Figure 10B:
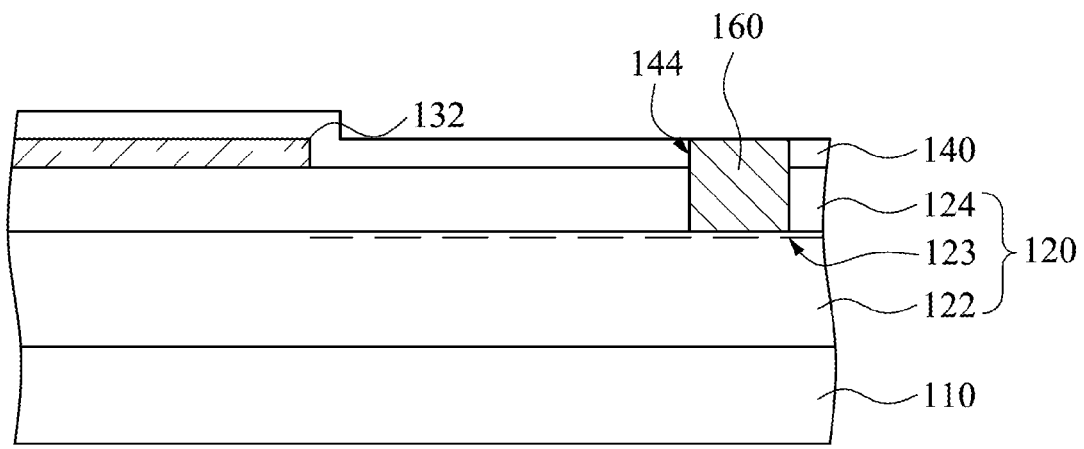
Figure 10C:
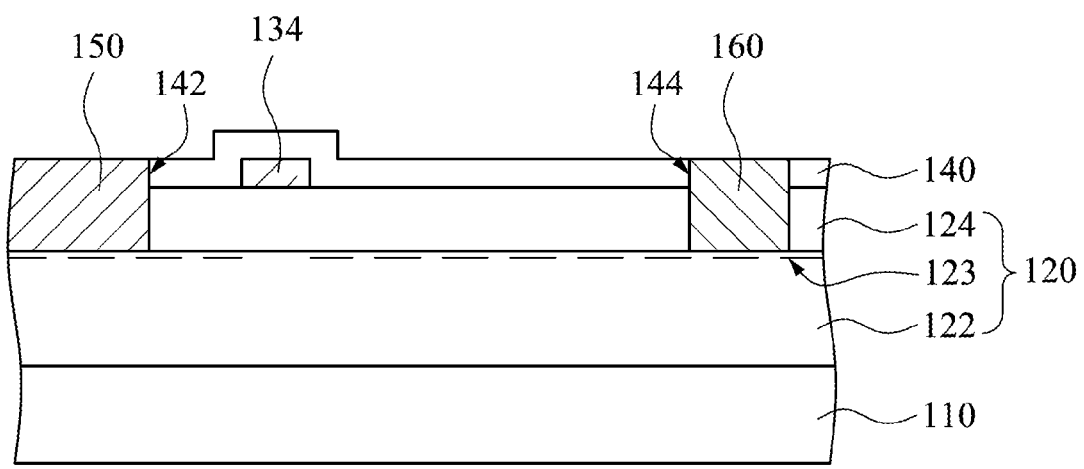

Reference is made to FIGS. 10A, 10B, and 10C. A passivation layer 140 is formed to cover the gate layers 130 and the active layer 120. The passivation layer 140 and the barrier layer 124 of the active layer 120 are then patterned to form a plurality of first openings 142 and a plurality of second openings 144, and the narrow portions 134 of the gate layers 130 are respectively disposed between the first openings 142 and the second openings 144. Parts of the wider portions 132 of the gate layers 130 extend toward the first openings 142. In other words, the first openings 142 are respectively formed in the accommodating spaces 136. The first openings 142 disposed between the adjacent gate layers 130 are arranged along the first direction D1 and separated from each other.

A plurality of source blocks 152 and a plurality of drain electrodes 160 are respectively formed in the first openings 142 and the second openings 144. The source blocks 152 disposed between the adjacent gate layers 130 are arranged along the first direction D1 and form a source electrode 150. In other words, the source blocks 152 of the source electrode 150 are surrounded by the connected gate layers 130.

Figure 11A:
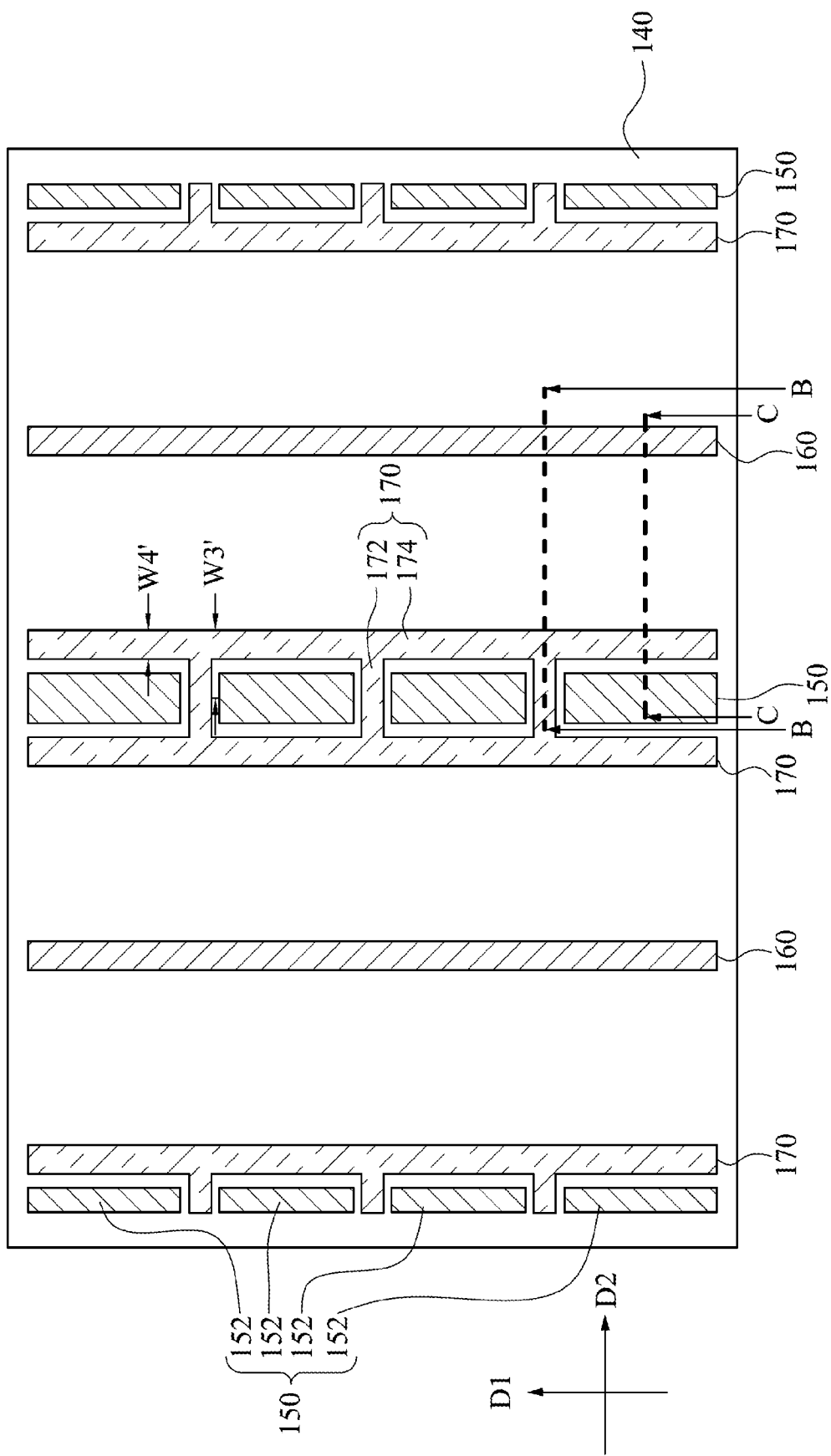
Figure 11B:
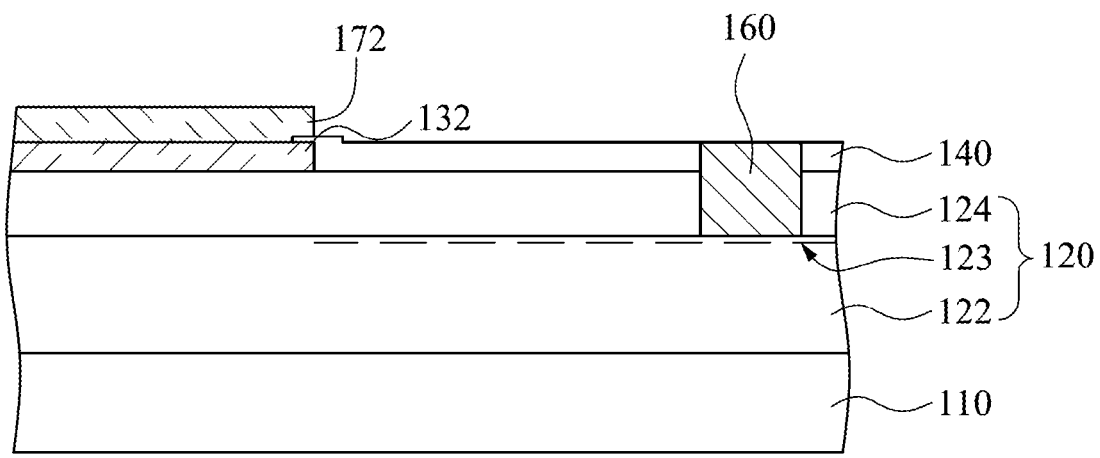
Figure 11C:
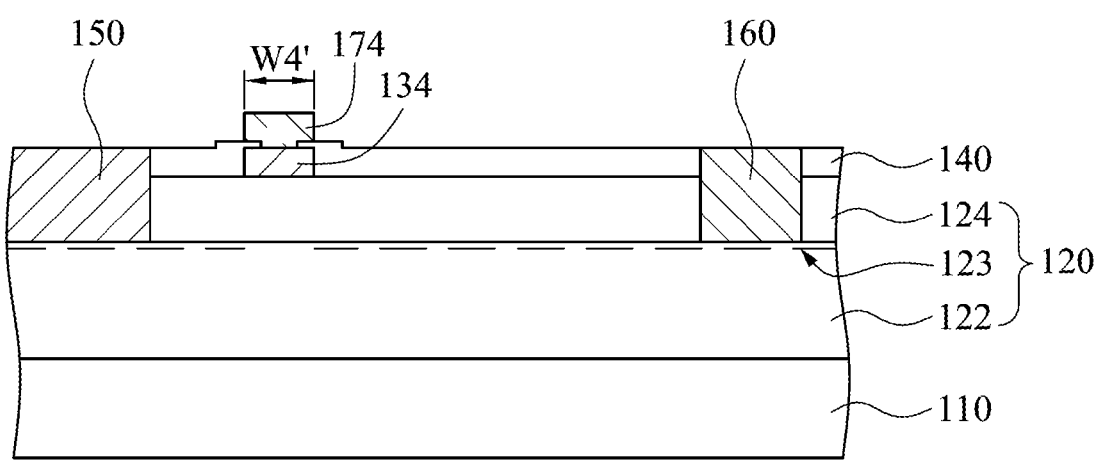

Reference is made to FIGS. 11A, 11B, and 11C. The passivation layer 140 is further patterned to expose the gate layers 130. Subsequently, a plurality of gate electrodes 170 are respectively formed on the gate layers 130. At least one of the gate electrodes 170 includes at least one wider portion 172 and at least one narrow portion 174 alternately arranged along the first direction D1. The width W3' of the wider portion 172 is wider than the width W4' of the narrow portion 174. For example, in FIG. 11A, one of the gate electrodes 170 includes three of the wider portions 172 and four of the narrow portions 174. Parts of the wider portions 174 of the gate electrodes 170 extend toward the source electrodes 150. In some embodiments, the gate electrodes 170 and the gate layers 130 have the substantially same or similar patterns. For example, in FIG. 11A, the gate electrodes 170 and the gate layers 130 (see FIG. 9A) have the substantially same pattern. However, in some other embodiments, the gate electrodes 170 and the gate layers 130 have different patterns. An embodiment falls within the claimed scope as long as the gate electrodes 170 overlap the gate layers 130. For example, the wider portions 172 of the gate electrodes 170 overlap the wider portions 132 of the gate layers 130, and the narrow portions 174 of the gate electrodes 170 overlap the narrow portions 134 of the gate layers 130.

Figure 12B:
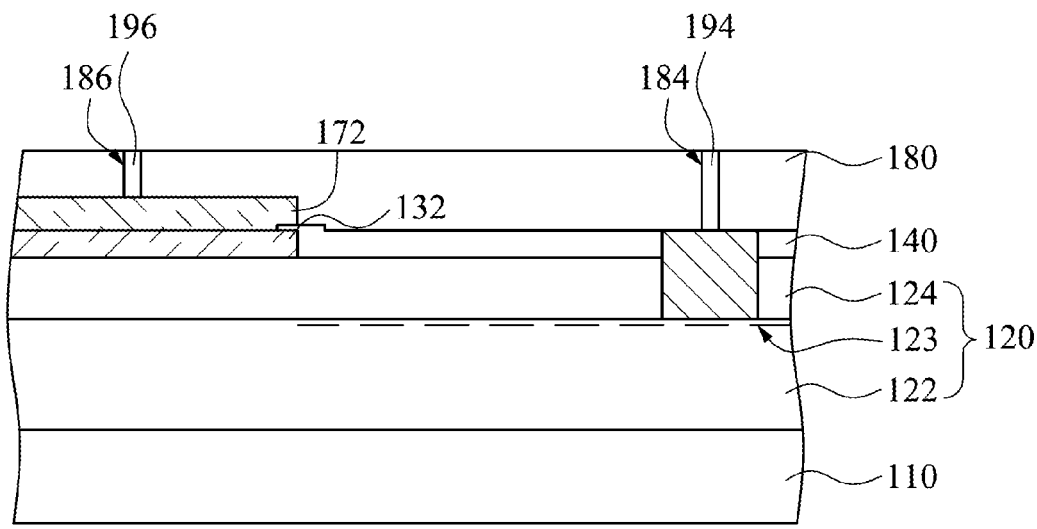
Figure 12C:
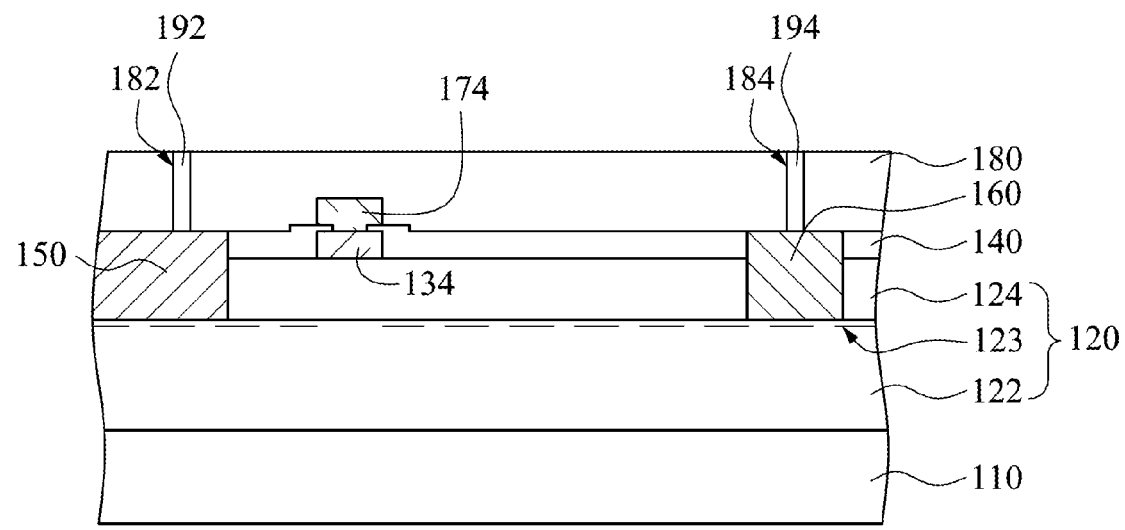

Reference is made to FIGS. 12A, 12B, and 12C. A first insulating layer 180 is formed to cover the source electrodes 150, the drain electrodes 160, and the gate electrodes 170. Subsequently, a plurality of through holes 182, 184, and 186 are formed in the first insulating layer 180. The through holes 182 expose the source electrodes 150, the through holes 184 expose the drain electrodes 160, and the through holes 186 expose the gate electrodes 170. In some embodiments, the through holes 186 are formed on the wider portions 172 of the gate electrodes 170. Then, vias 192, 194, and 196 are respectively formed in the through holes 182, 184, and 186. That is, the vias 192 are present on the source electrodes 150, the vias 194 are present on the drain electrodes 160, and the vias 196 are present on the gate electrodes 170.

Figure 13A:
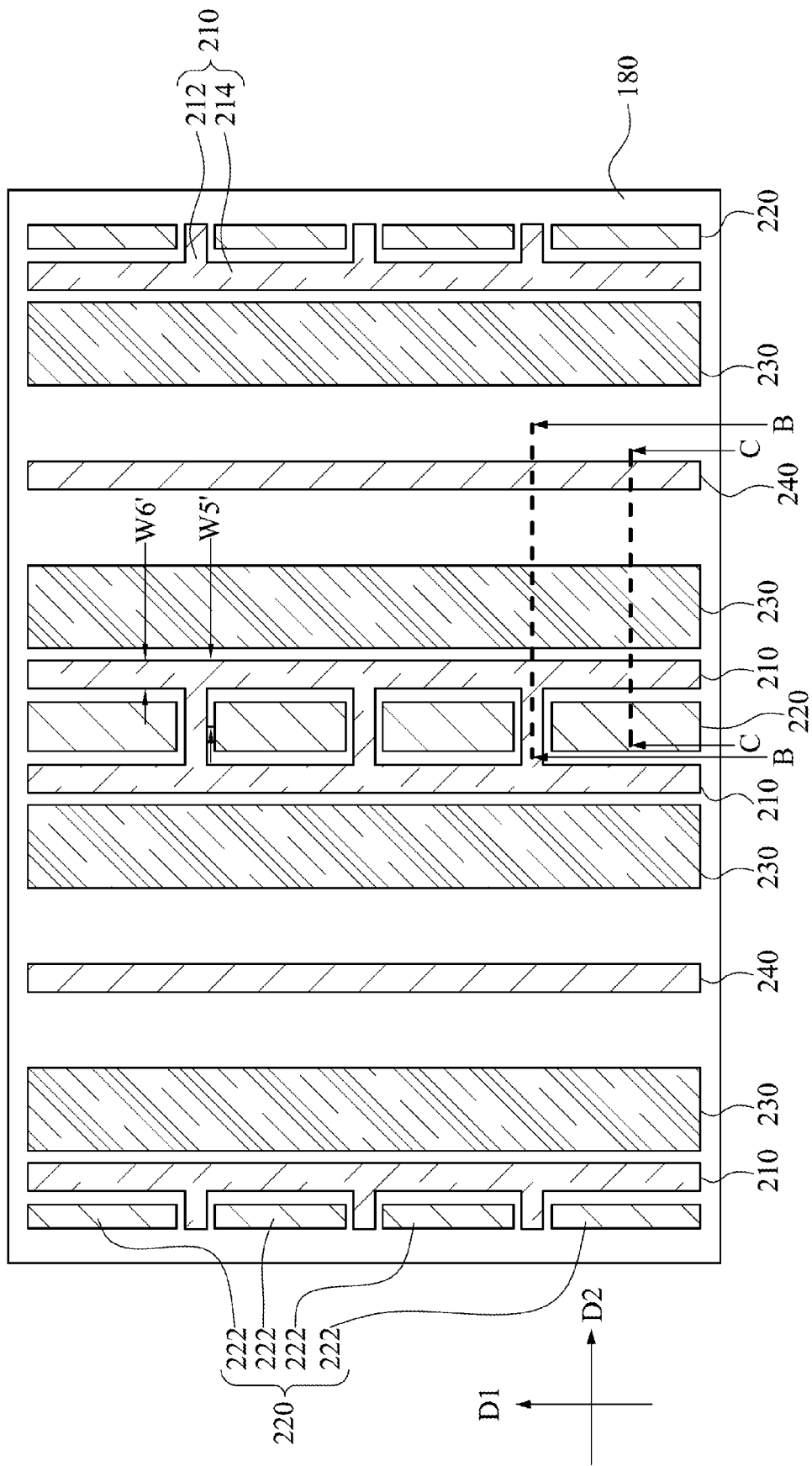
Figure 13B:
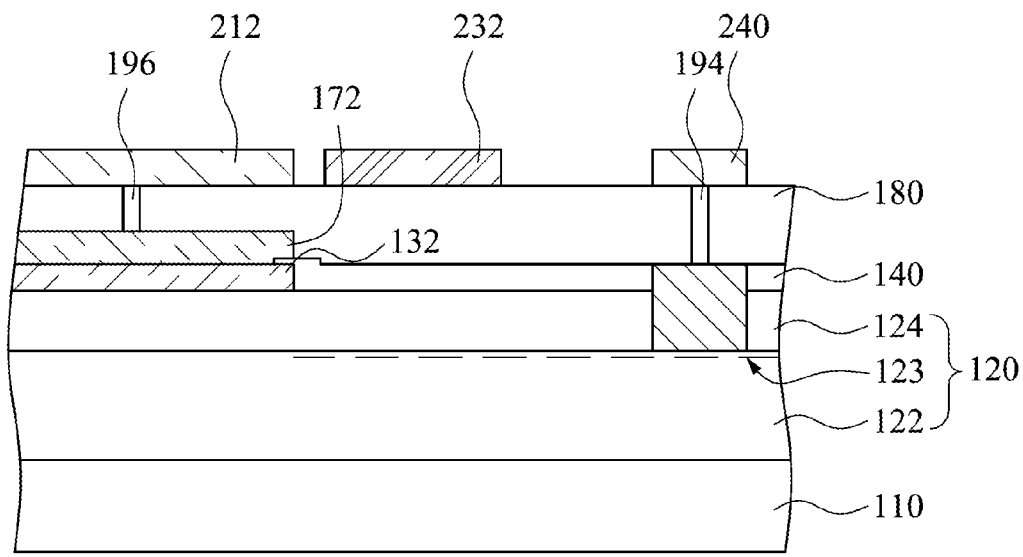
Figure 13C:
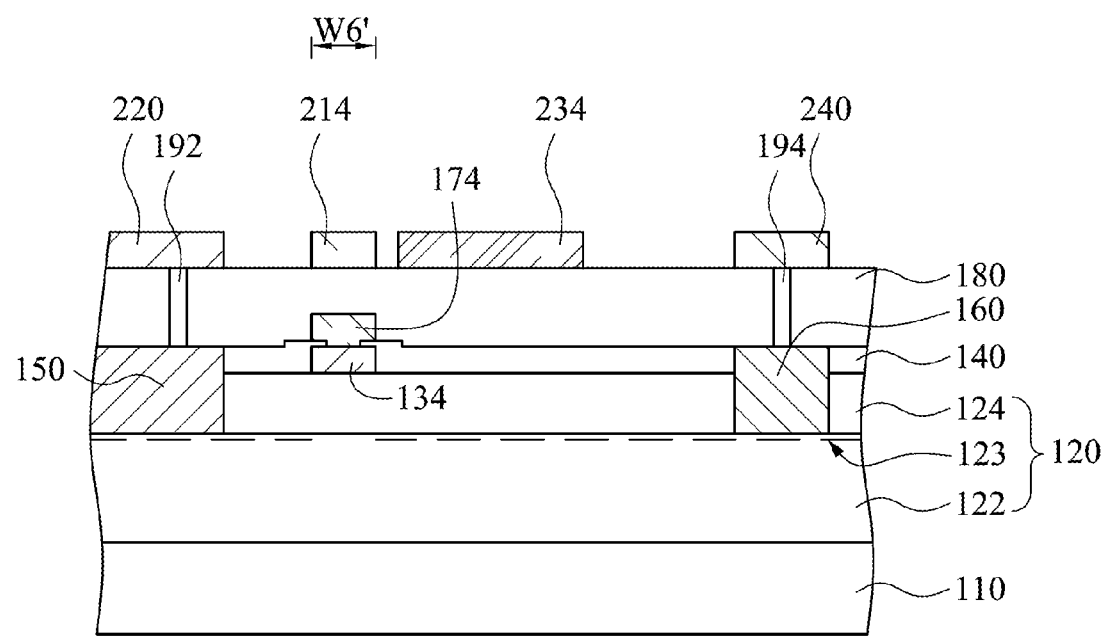

Reference is made to FIGS. 13A, 13B, and 13C. A metal layer (not shown) is formed on the first insulating layer 180 and is patterned to be a plurality of gate metal layers 210, a plurality of first source metal layers 220, a plurality of second source metal layers 230, and a plurality of drain metal layers 240. That is, the gate metal layers 210, the first source metal layers 220, the second source metal layers 230, and the drain metal layers 240 are present on the same level. In greater detail, the gate metal layers 210 are respectively formed above the gate electrodes 170. That is, the vias 196 are connected to the wider portions 172 of the gate electrodes 170 and the gate metal layers 210. At least one of the gate metal layers 210 includes at least one wider portion 212 and at least one narrow portion 214 alternately arranged along the first direction D1. The width W5' of the wider portion 212 is wider than the width W6' of the narrow portion 214. For example, in FIG. 13A, one of the gate metal layers 210 includes three of the wider portions 212 and four of the narrow portions 214. Parts of the wider portions 214 of the gate metal layers 210 extend toward the source metal layers 220. In some embodiments, the gate metal layers 210 and the gate electrodes 170 have the substantially same or similar patterns. For example, in FIG. 13A, the gate metal layers 210 and the gate electrodes 170 (see FIG. 11A) have the substantially same pattern. That is, the gate metal layers 210 and the gate electrodes 170 substantially extend along the first direction D1. However, in some other embodiments, the gate metal layers 210 and the gate electrodes 170 have different patterns. An embodiment falls within the claimed scope as long as the gate metal layers 210 overlap the gate electrodes 170. For example, the wider portions 212 of the gate metal layers 210 overlap the wider portions 172 of the gate electrodes 170, and the narrow portions 214 of the gate metal layers 210 overlap the narrow portions 174 of the gate electrodes 170. The vias 196 are disposed between the wider portions 212 of the gate metal layers 210 and the wider portions 172 of the gate electrodes 170.

Since the gate metal layers 210 are connected to the gate electrodes 170, the resistance of the whole gate (the gate electrodes 170 and the gate metal layers 210) of the semiconductor device can be reduced. Furthermore, the vias 196 are disposed between the wider portions 212 of the gate metal layers 210 and the wider portions 172 of the gate electrodes 170. The wider portions 172 of the gate electrodes 170 have flat top surface, such that the formation of the vias 196 can be improved, and the vias 196 provide good connection between the gate metal layers 210 and the gate electrodes 170.

The first source metal layers 220 are respectively formed above the source electrodes 150. At least one of the first source metal layers 220 includes a plurality of source blocks 222 separated from each other. The source blocks 222 of the first source metal layers 220 are respectively disposed above the source blocks 152 of the source electrodes 150. At least one of the source blocks 222 of the first source metal layers 220 is surrounded by the connected gate metal layers 210. The vias 192 are disposed between and connected to the source blocks 152 of the source electrodes 150 and the source blocks 222 of the first source metal layers 220. In some embodiments, the first source metal layers 220 and the source electrodes 150 have the substantially same or similar patterns. For example, in FIG. 13A, the first source metal layers 220 and the source electrodes 150 (see FIG. 11A) have the substantially same pattern. However, in some other embodiments, the first source metal layers 220 and the source electrodes 150 have different patterns. An embodiment falls within the claimed scope as long as the source blocks 222 of the first source metal layers 220 overlap the source blocks 152 of the source electrodes 150.

The drain metal layers 240 are respectively formed above the drain electrodes 160. That is, the vias 194 are disposed between and connected to the drain electrodes 160 and the drain metal layers 240. In some embodiments, the drain metal layers 240 and the drain electrodes 160 have the substantially same or similar patterns. For example, in FIG. 13A, the drain metal layers 240 and the drain electrodes 160 (see FIG. 11A) have the substantially same pattern. However, in some other embodiments, the drain metal layers 240 and the drain electrodes 160 have different patterns. An embodiment falls within the claimed scope as long as the drain metal layers 240 overlap the drain electrodes 160.

The second source metal layers 230 are disposed on the first insulating layer 180 and respectively between the gate metal layers 210 and the drain metal layers 240. The second source metal layers 230 are configured to disperse the electrical field of the semiconductor device to increase the breakdown voltage. In FIG. 13A, the gate metal layers 210, the first source metal layers 220, the second source metal layers 230, and the drain metal layers 240 substantially extend along the first direction D1.

Figure 14A:
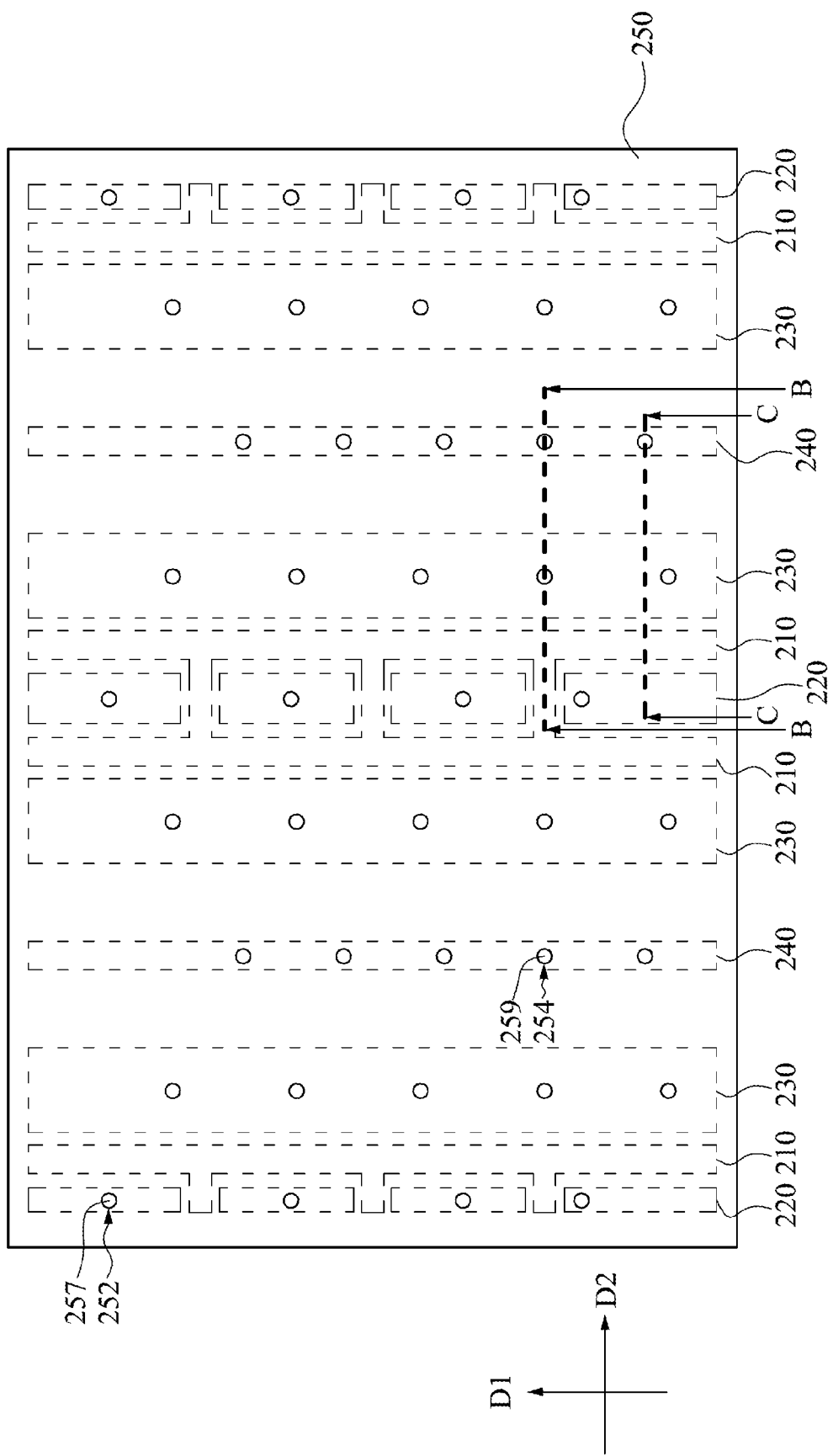
Figure 14B:
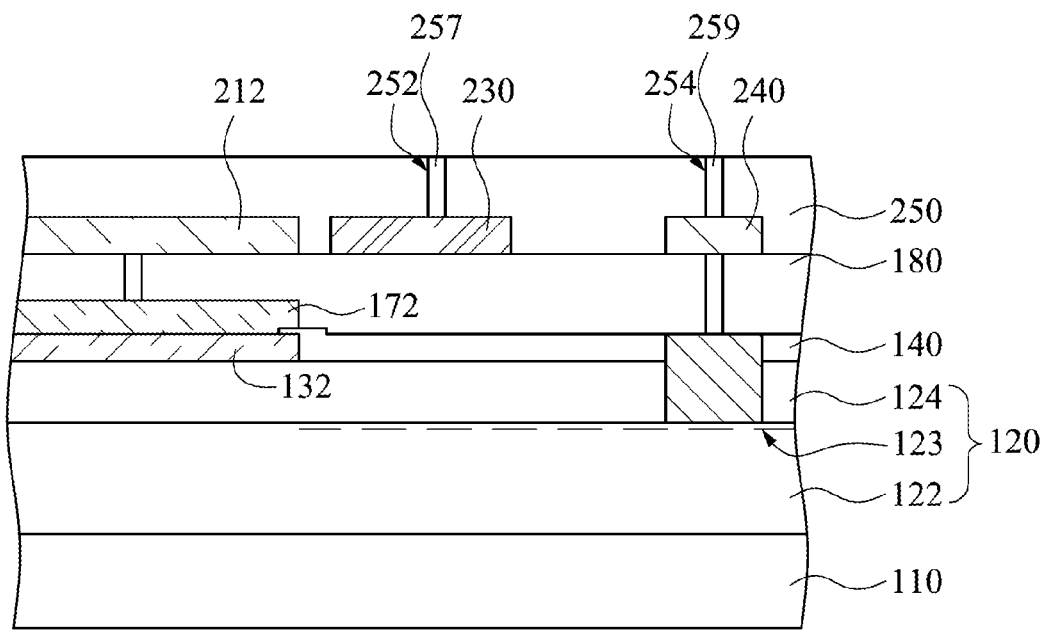
Figure 14C:
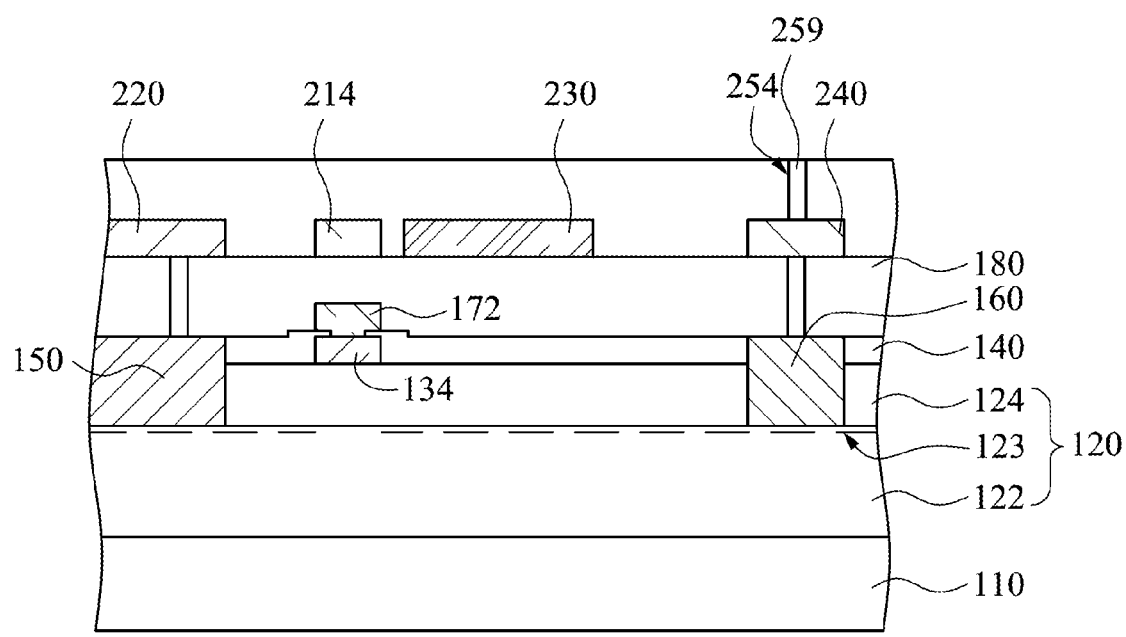

Reference is made to FIGS. 14A, 14B, and 14C. A second insulating layer 250 is formed to cover the gate metal layers 210, the first source metal layers 220, the second source metal layers 230, and the drain metal layers 240. Subsequently, a plurality of through holes 252 and 254 are formed in the second insulating layer 250. The through holes 252 expose the first source metal layers 220 and the second source metal layers 230, and the through holes 254 expose the drain metal layers 240. Then, vias 257 and 259 are respectively formed in the through holes 252 and 254. That is, the vias 257 are present on the first source metal layers 220 and the second source metal layers 230, and the vias 259 are present on the drain metal layers 240.

Figure 15A:
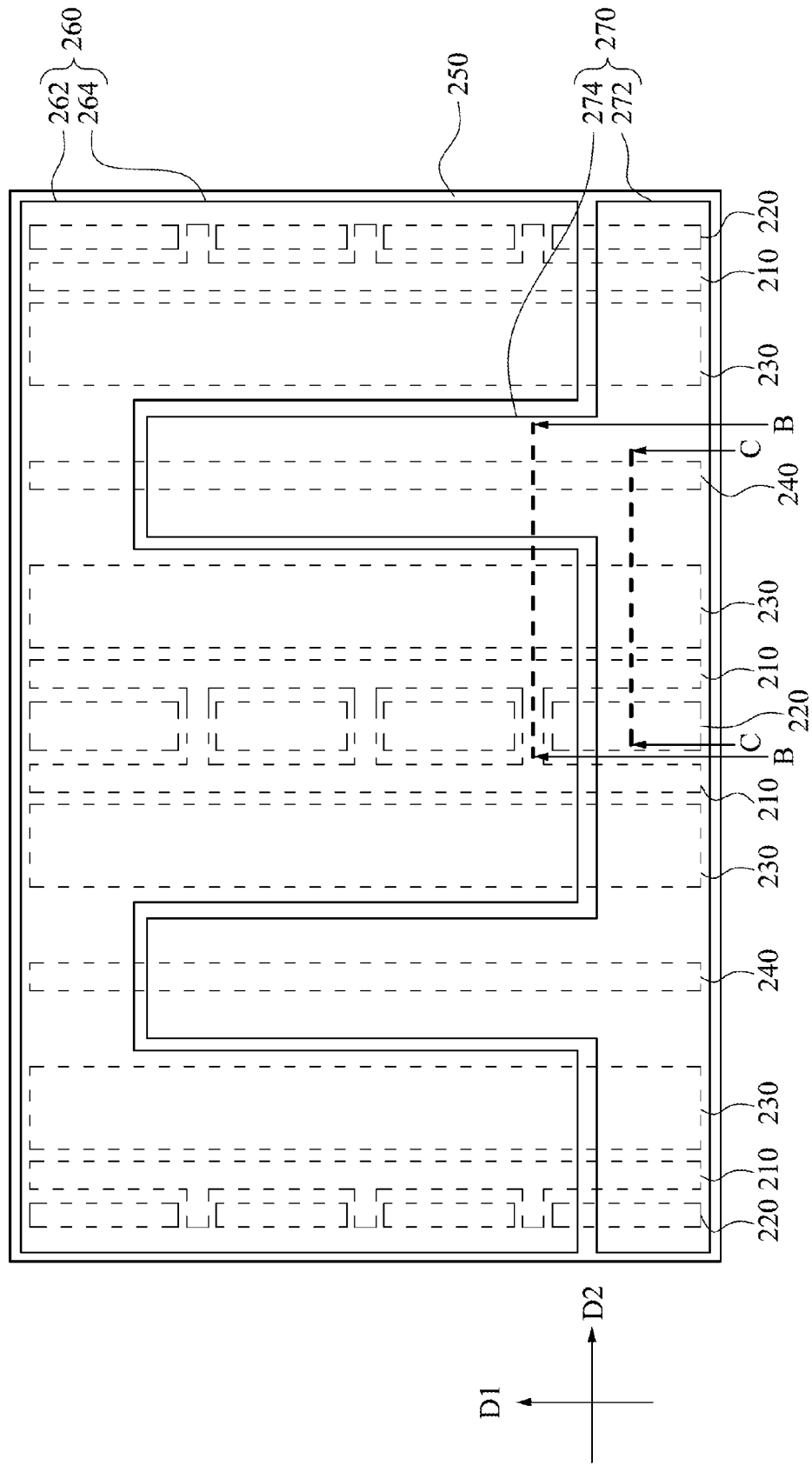
Figure 15B:
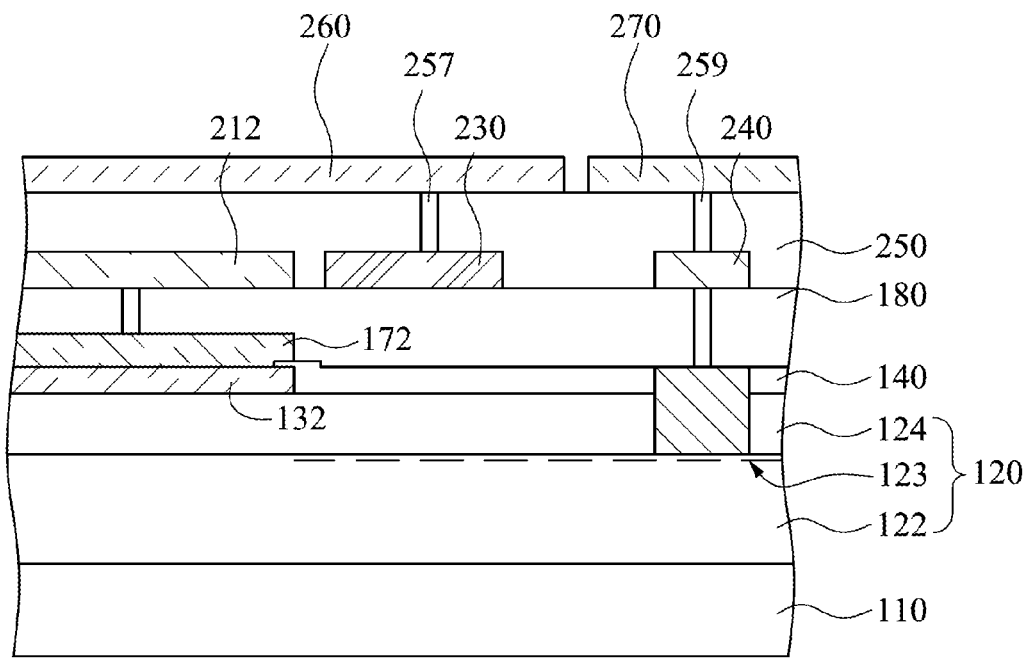
Figure 15C:
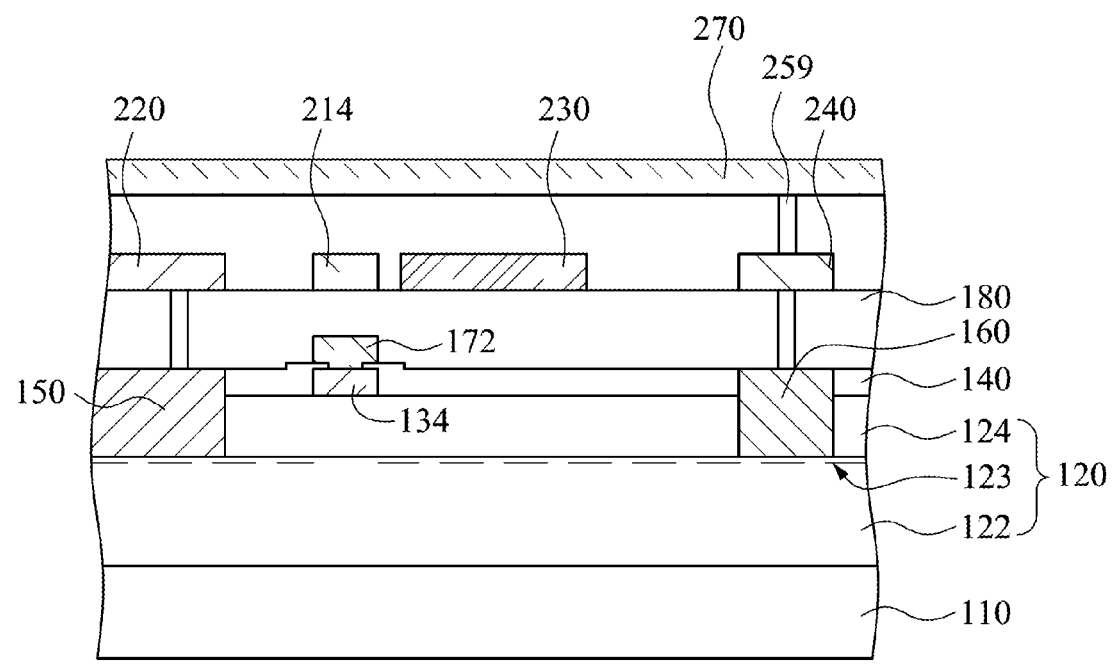

Reference is made to FIGS. 15A, 15B, and 15C. Another metal layer (not shown) is formed on the second insulating layer 250 and is patterned to be a source pad 260 and a drain pad 270. That is, the source pad 260 and the drain pad 270 are present on the same level. In some embodiments, the source pad 260 includes a main body 262 and at least one branch 264. For example, in FIG. 15A, there are three of the branches 264. The main body 262 extends along the second direction D2 while the branches 264 extend along the first direction D1. The branches 264 are disposed above the first source metal layers 220 and the second source metal layers 230. The vias 257 are disposed between and connected to the source pad 260 and the source blocks 222 of the first source metal layers 220/the second source metal layers 230. In some embodiments, the drain pad 270 includes a main body 272 and at least one branch 274. For example, in FIG. 15A, there are two of the branches 274. The main body 272 extends along the second direction D2 while the branches 274 extend along the first direction D1. The branches 264 of the source pad 260 and the branches 274 of the drain pad 270 are alternately arranged along the second direction D2. The branches 274 are disposed above the drain metal layers 240. The vias 259 are disposed between and connected to the drain pad 270 and the drain metal layers 240. It is noted that the patterns of the source pad 260 and the drain pad 270 are illustrative, and should not limit the claimed scope of the present disclosure. A person having ordinary skill in the art may design suitable patterns for the source pad 260 and the drain pad 270 according to actual situations. In some embodiments, the semiconductor device further includes a gate pad (not shown), and the gate pad is electrically connected to the gate metal layers 210 and/or the gate electrodes 170.

Figure 16:
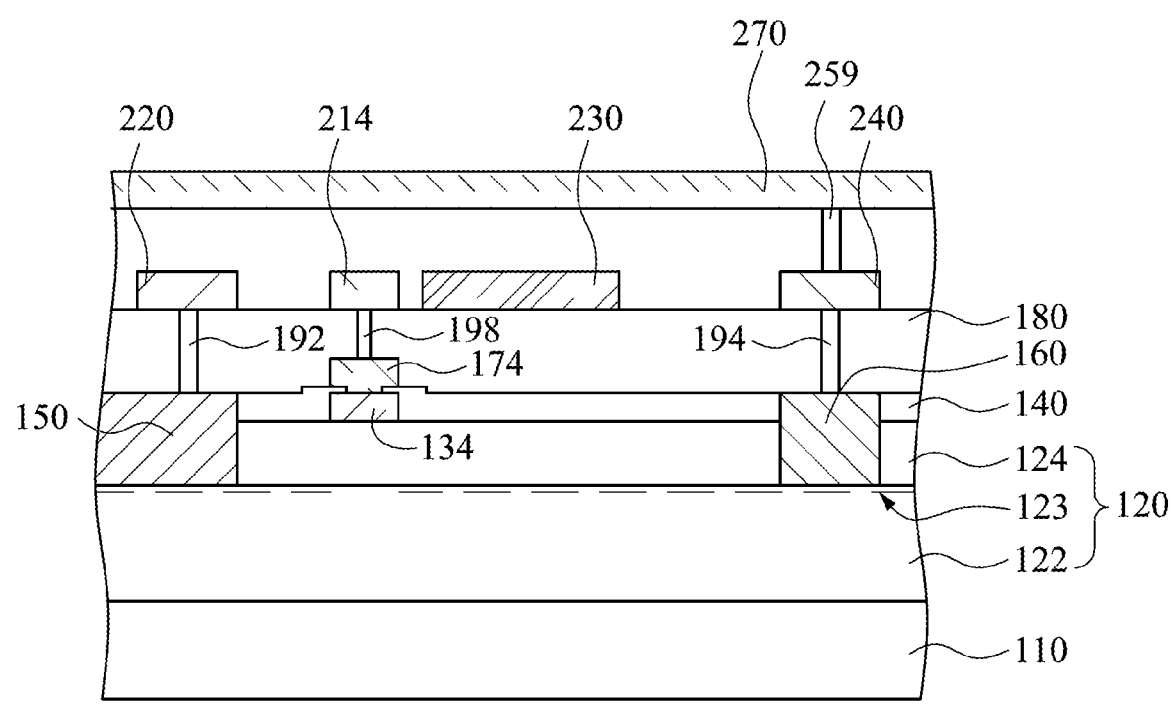
FIG. 16 is a cross sectional view of a semiconductor device according to some embodiments.

FIG. 16 is a cross sectional view of a semiconductor device according to some embodiments. The position of the cross sectional view of FIG. 16 is the same as the position of the cross sectional view of FIG. 15C. In FIG. 16, the semiconductor device further includes vias 198 disposed in the first insulating layer 180 and connected to the narrow portion 174 of the gate electrode 170 and the narrow portion 214 of the gate metal layer 210. With this configuration, the resistance of the whole gate (the gate electrodes 170 and the gate metal layers 210) can be further reduced. Other relevant structural details of the semiconductor device of FIG. 16 are similar to the semiconductor device of FIG. 15C, and, therefore, a description in this regard will not be repeated hereinafter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor device comprising:
   an active layer;
   at least one source electrode and at least one drain electrode present on the active layer;
   at least one gate electrode present on the active layer and between the source electrode and the drain electrode;
   a first insulating layer present on the source electrode, the drain electrode, and the gate electrode;
   at least one gate metal layer present on the gate electrode and the first insulating layer, wherein the gate metal layer comprises a plurality of narrow portions and a plurality of wider portions arranged along a direction, at least one of the wider portions of the gate metal layer is in direct contact with two adjacent narrow portions of the gate metal layer, and the gate electrode is arranged along the direction;
   a plurality of vias present between the gate metal layer and the gate electrode;
   at least one first source metal layer present on the source electrode and the first insulating layer;
   at least one drain metal layer present on the drain electrode and the first insulating layer; and
   at least one second source metal layer present on the first insulating layer and at the same level as the gate metal layer and the drain metal layer, wherein the second source metal layer comprises a plurality of narrow portions and a plurality of wider portions, the narrow portions of the second source metal layer are adjacent respectively to the wider portions of the gate metal layer, and the wider portions of the second source metal layer are adjacent respectively to the narrow portions of the gate metal layer, and a projection of all of the gate metal layer onto the active layer in a direction normal to the upper surface of the substrate is separated from a projection of the second source metal layer onto the active layer in the direction normal to the upper surface of the substrate and a projection of the drain metal layer onto the active layer in the direction normal to the upper surface of the substrate.

2. The semiconductor device of claim 1, wherein the gate metal layer, the first source metal layer, the second source metal layer, and the drain metal layer substantially extend along the direction.

3. The semiconductor device of claim 1, wherein the wider portions of the gate metal layer extends toward the drain metal layer.

4. The semiconductor device of claim 1, wherein the gate electrode comprises a plurality of narrow portions and a plurality of wider portions arranged along the direction.

5. The semiconductor device of claim 4, wherein the wider portions of the gate electrode extends toward the drain electrode.

6. The semiconductor device of claim 4, wherein the vias connect the wider portions of the gate metal layer directly the wider portions of the gate electrode.

7. The semiconductor device of claim 4, wherein at least one of the wider portions of the gate metal layer overlaps at least one the wider portions of the gate electrode, and at least one of the narrow portions of the gate metal layer overlaps at least one of the narrow portions of the gate electrode.

8. The semiconductor device of claim 1, further comprising:
   a second insulating layer present on the gate metal layer, the first source metal layer, the second source metal layer, and the drain metal layer;
   a source pad present on the second insulating layer and connected to the first source metal layer and the second source metal layer; and
   a drain pad present on the second insulating layer and connected to the drain metal layer.

9. The semiconductor device of claim 1, wherein the vias connect the wider portions of the gate metal layer directly to the gate electrode.

10. The semiconductor device of claim 1, wherein the vias are present between the narrow portions of the gate metal layer and the gate electrode.

11. The semiconductor device of claim 1, further comprising a gate layer present between the gate electrode and the active layer, wherein the gate layer comprises p-type material.

12. The semiconductor device of claim 1, wherein the gate metal layer and the gate electrode have substantially the same pattern.

13. The semiconductor device of claim 1, wherein the first source metal layer and the second source metal layer have different patterns.

14. A semiconductor device comprising:
    an active layer;
    a plurality of source electrodes, drain electrodes, and gate electrodes over the active layer;
    an insulating layer over the source electrodes, the drain electrodes, and the gate electrodes;
    a plurality of gate metal layers over the gate electrodes and the insulating layer, wherein the gate metal layers comprise a plurality of narrow portions and wider portions alternately arranged, and the wider portions of one of the gate metal layers are directly connected to the wider portions of another one of the gate metal layers;
    a plurality of source metal layers over the source electrodes and the insulating layer; and
    a plurality of drain metal layers over the drain electrodes and the insulating layer.

15. The semiconductor device of claim 14, wherein the gate metal layers and the gate electrodes have substantially the same pattern.

16. The semiconductor device of claim 14, wherein the source metal layer comprises a plurality of source blocks spaced from each other.

17. The semiconductor device of claim 16, wherein at least one of the source blocks is surrounded by the connected gate metal layers.

18. The semiconductor device of claim 14, wherein the gate electrodes comprise a plurality of narrow portions and a plurality of wider portions alternately arranged, and the wider portions of one of the gate electrodes are directly connected to the wider portions of another one of the gate electrodes.

19. The semiconductor device of claim 18, wherein at least one of the source electrodes comprise a plurality of source blocks disposed in spaces between the connected gate electrodes.

20. The semiconductor device of claim 14, wherein a projection of all of the gate metal layer onto the active layer in a direction normal to the upper surface of the substrate is separated from a projection of the source metal layer onto the active layer in a direction normal to the upper surface of the substrate and a projection of the drain metal layer onto the active layer in a direction normal to the upper surface of the substrate.

* * * * *